(12) United States Patent
Lee et al.

(10) Patent No.: US 9,355,903 B2
(45) Date of Patent: May 31, 2016

(54) SEMICONDUCTOR DEVICE WITH AIR GAP AND METHOD FOR FABRICATING THE SAME

(71) Applicant: SK hynix, Inc., Gyeonggi-do (KR)

(72) Inventors: Nam-Yeal Lee, Gyeonggi-do (KR); Seung-Jin Yeom, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/676,454

(22) Filed: Apr. 1, 2015

(65) Prior Publication Data
US 2015/0206800 A1 Jul. 23, 2015

Related U.S. Application Data

(62) Division of application No. 14/081,533, filed on Nov. 15, 2013, now Pat. No. 9,024,371.

(30) Foreign Application Priority Data

Jul. 12, 2013 (KR) .......................... 10-2013-0081885

(51) Int. Cl.
*H01L 21/4763* (2006.01)
*H01L 21/768* (2006.01)
*H01L 23/532* (2006.01)
*H01L 27/108* (2006.01)
*H01L 23/522* (2006.01)
*H01L 23/528* (2006.01)
*H01L 21/764* (2006.01)

(52) U.S. Cl.
CPC ........ *H01L 21/76895* (2013.01); *H01L 21/764* (2013.01); *H01L 21/7682* (2013.01); *H01L 21/76889* (2013.01); *H01L 23/528* (2013.01); *H01L 23/5222* (2013.01); *H01L 23/5329* (2013.01); *H01L 23/53266* (2013.01); *H01L 23/53295* (2013.01); *H01L 27/10814* (2013.01); *H01L 27/10855* (2013.01); *H01L 27/10876* (2013.01); *H01L 27/10885* (2013.01); *H01L 23/53271* (2013.01); *H01L 2924/0002* (2013.01)

(58) Field of Classification Search
CPC ................... H01L 21/76895; H01L 21/76889; H01L 21/764; H01L 21/7681; H01L 23/53266; H01L 23/53295; H01L 23/5329; H01L 27/10855; H01L 27/10885; H01L 27/10876
See application file for complete search history.

(56) References Cited

U.S. PATENT DOCUMENTS

2014/0179102 A1* 6/2014 Joung .................... H01L 21/764
438/666
2014/0187037 A1* 7/2014 Rho ........................ H01L 29/92
438/626

* cited by examiner

*Primary Examiner* — A. Sefer
(74) *Attorney, Agent, or Firm* — IP & T Group LLP

(57) ABSTRACT

A semiconductor device includes a dielectric structure which has an opening exposing a surface of a substrate; and a conductive structure which is formed in the opening, wherein the conductive structure comprises: a first conductive pattern recessed in the opening; a second conductive pattern covering a top surface and sidewalls of the first conductive pattern; an air gap defined between sidewalls of the opening and the second conductive pattern; and a third conductive pattern capping the second conductive pattern and the air gap.

11 Claims, 28 Drawing Sheets

SEMICONDUCTOR DEVICE WITH AIR GAP AND METHOD FOR FABRICATING THE SAME

CROSS-REFERENCE TO RELATED APPLICATIONS

This application is a division of U.S. patent application Ser. No. 14/081,533 filed on Nov. 15, 2013, which claims priority of Korean Patent Application No. 10-2013-0081885, filed on Jul. 12, 2013. The disclosure of each of the foregoing application is incorporated herein by reference in its entirety.

BACKGROUND

1. Field

Exemplary embodiments of the present invention relate to a semiconductor device, and more particularly, to a semiconductor device with air gaps and a method for fabricating the same.

2. Description of the Related Art

In general, in a semiconductor device, a dielectric material is formed between adjacent conductive structures. As a semiconductor device is highly integrated, a distance between conductive structures is gradually decreasing, thus, parasitic capacitance increases. As parasitic capacitance increases, the performance of the semiconductor device is degraded.

To reduce parasitic capacitance, the dielectric constant o a dielectric material may be decreased. However, since the dielectric material has a high dielectric constant, limitations may exist in reducing parasitic capacitance.

SUMMARY

Various exemplary embodiments are directed to a semiconductor device capable of reducing the parasitic capacitance between adjacent conductive structures, and a method for fabricating the same.

In an exemplary embodiment, a semiconductor device may include: a dielectric structure which has an opening exposing a surface of a substrate; and a conductive structure which is formed in the opening, wherein the conductive structure comprises: a first conductive pattern recessed in the opening; a second conductive pattern covering a top surface and side walls of the first conductive pattern; an air gap defined between sidewalls of the opening and the second conductive pattern; and a third conductive pattern capping the second conductive pattern and the air gap.

In an exemplary embodiment, a semiconductor device may include: a dielectric structure which has an opening exposing a surface of a substrate; and a conductive structure which is formed in the opening, wherein the conductive structure comprises: a first conductive pattern recessed in the opening and including metal silicide; an air gap defined between sidewalls of the opening and the first conductive pattern; and a second conductive pattern capping the first conductive pattern and the air gap.

In an exemplary embodiment, a semiconductor device may include: a plurality of conductive structures including first conductive patterns which are formed over a substrate; second conductive patterns recessed between the conductive structures; third conductive patterns covering top surfaces and sidewalls of the second conductive patterns; air gaps defined between the first conductive patterns and the third conductive patterns; and fourth conductive patterns capping the air gaps and the third conductive patterns.

In an exemplary embodiment, a semiconductor device may include: a plurality of bit line structures including bit lines which are formed over a substrate; first plugs recessed between the bit line structures and including metal silicide; air gaps defined between the first plugs and the bit line structures; and second plugs capping the air gaps and the first plugs.

In an exemplary embodiment, a method for fabricating a semiconductor device may include: forming a plurality of conductive structures including first conductive patterns over a substrate; forming a dielectric layer over the conductive structures; etching the dielectric layer to define openings between the conductive structures; forming sacrificial spacers over sidewalls of the openings; forming second conductive patterns recessed in the openings over the sacrificial spacers; removing the sacrificial spacers to define air gaps; forming third conductive patterns which are separated from the first conductive patterns by the air gaps and cover sidewalls and top surfaces of the second conductive patterns; and forming fourth conductive patterns which cap the air gaps over the third conductive patterns.

In an exemplary embodiment, a method for fabricating a semiconductor device may include: forming a plurality of conductive structures including first conductive patterns over a substrate; forming a dielectric layer over the conductive structures; etching the dielectric layer to define openings between the conductive structures; forming sacrificial spacers over sidewalls of the openings; forming second conductive patterns recessed in the openings over the sacrificial spacers, the second conductive patterns including metal silicide; removing the sacrificial spacers to define air gaps; and forming third conductive patterns which cap the air gaps over the second conductive patterns.

In an exemplary embodiment, a method for fabricating a semiconductor device may include: forming a plurality of bit line structures including bit lines over a substrate; forming a dielectric layer over the bit line structures; etching the dielectric layer to define contact holes between the bit line structures; forming sacrificial spacers over sidewalls of the contact holes; forming silicon plugs recessed in the contact holes over the sacrificial spacers; removing the sacrificial spacers to define air gaps; forming ohmic contact layers which are separated from the bit lines by the air gaps that cover sidewalls and top surfaces of the silicon plugs; and forming metal plugs which cap the air gaps over the ohmic contact layer.

In an exemplary embodiment, a method for fabricating a semiconductor device may include: forming a plurality of bit line structures including bit lines over a substrate; forming a dielectric layer over the bit line structures; etching the dielectric layer to define openings between the bit line structures; forming sacrificial spacers over sidewalls of the openings; forming silicide plugs recessed in the openings over the sacrificial spacers; removing the sacrificial spacers to define air gaps; and forming metal plugs which cap the air gaps over the silicide plugs.

In an exemplary embodiment, a method for fabricating a semiconductor device may include: forming isolation regions in a substrate which isolate first regions and second regions from each other; forming bit line structures and gate structures in the first regions and the second regions, respectively; forming a dielectric layer over the bit line structures; etching the dielectric layer to define contact holes between the bit line structures; forming sacrificial spacers over sidewalls of the contact holes; forming silicon plugs recessed in the contact holes over the sacrificial spacers; removing the sacrificial spacers to define air gaps; forming ohmic contact layers which are separated from the bit line structures by the air gaps that cover sidewalls and top surface of the silicon plugs; forming metal plugs which cap the air gaps over the ohmic contact layer; and forming capacitors over the metal plugs.

In accordance with the above embodiments, since air gaps are defined between conductive structures, parasitic capacitance (Cb) may be reduced.

Additionally, since conductive structures include a silicide layer, the sheet resistance (Rs) of the conductive structures may be reduced. In particular, since a low resistance silicide layer is included, the sheet resistance (Rs) of the conductive structures may be further reduced. As the sheet resistance (Rs) is reduced, a contact resistance (Rc) may be improved.

Further, since a contact area increases as an ohmic contact layer covers a silicon plug, the contact resistance (Rc) of the conductive structures may be further improved. Moreover, it is possible to cap the air gaps using a conductive material without using a dielectric material. As a consequence, a parasitic capacitance (Cb) may be reduced due to the air gaps, a sheet resistance (Rs) may be reduced by the low resistance silicide layer, and the contact resistance (Rc) of the conductive structures may be improved attributable to an increase in contact area.

DETAILED DESCRIPTION

Figure 1A:
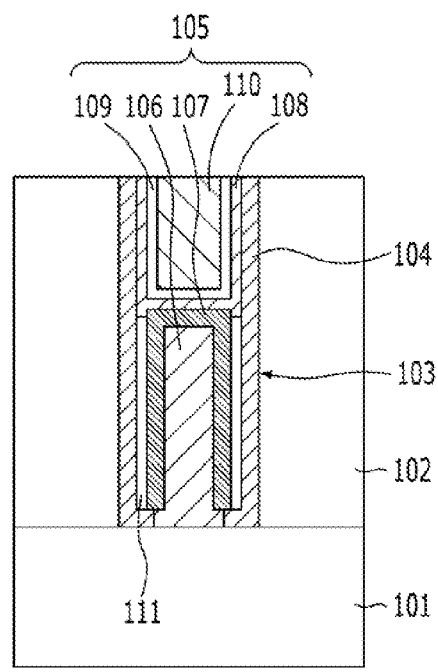
FIG. 1A is a cross-sectional view illustrating a semiconductor device in accordance with a first embodiment.

Various exemplary embodiments will be described b in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) in between, and that "over" means not only directly on top but also on top of something with an intermediate feature(s) or a layer(s) in between. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1A is a cross-sectional view illustrating a semiconductor device in accordance with a first embodiment.

Referring to FIG. 1A, a dielectric layer 102 is formed on a substrate 101. An opening 103 is defined in the dielectric layer 102 to expose the surface of the substrate 101. A conductive structure 105 is formed in the opening 103. The conductive structure 105 includes a first conductive pattern 106 and a third conductive pattern 110. The third conductive pattern 110 is formed over the first conductive pattern 106. A second conductive pattern 107 is formed between the first conductive pattern 106 and the third conductive pattern 110. The second conductive pattern 107 covers the top surface and the sidewalls of the first conductive pattern 106. A barrier pattern 108 and a glue pattern 109 are formed between the second conductive pattern 107 and the third conductive pattern 110. An air gap 111 is defined between the second conductive pattern 107 and the sidewalls of the opening 103. The barrier pattern 108 caps the air gap 111 and covers the top surface of the second conductive pattern 107. A spacer 104 may be formed on the sidewalls of the opening 103.

The substrate 101 includes a silicon substrate, a silicon-germanium substrate, or a silicon-on-insulator (SOI) substrate. The dielectric layer 102 includes a low-k material. The dielectric layer 102 may include silicon nitride or silicon oxide. The dielectric layer 102 serves as an interlayer dielectric layer.

The opening 103 may have a hole shape or a line shape. For example, the opening 103 includes a contact hole, a via hole, a through hole, a trench, a recess, or the like. When the opening 103 is a contact hole, the conductive structure 105 becomes a contact plug.

Each of the first conductive pattern 106 and the third conductive pattern 110 includes a silicon-containing material or a metal-containing material. The first conductive pattern 106 and the third conductive pattern 110 may include the same conductive material or different conductive materials. For example, the first conductive pattern 106 includes a silicon-containing material, and the third conductive pattern 110 includes a metal-containing material. The first conductive pattern 106 may include polysilicon, and the third conductive pattern 110 may include tungsten. When the silicon-containing material and the metal-containing material contact each other, an ohmic contact is required. For such an ohmic contact, the second conductive pattern 107 is formed.

The second conductive pattern 107 covers the top surface and the sidewalls of the first conductive pattern 106. The second conductive pattern 107 includes silicide. The second conductive pattern 107 may include metal silicide. The second conductive pattern 107 may include titanium silicide, cobalt silicide, nickel silicide or tungsten silicide. In the exemplary embodiment, the second conductive pattern 107 includes cobalt silicide. The second conductive pattern 107 includes cobalt silicide with a phase of $CoSi_2$.

The spacer 104 includes a low-k material. The low-k material includes oxide or nitride. The low--: material may include silicon oxide, silicon nitride or metal oxide. The spacer 104 includes $SiO_2$, $Si_3N_4$ or SIN. The spacer 104 may be omitted.

The air gap 111 may be defined by removing a sacrificial material formed between the spacer 104 and the second conductive pattern 107.

The barrier pattern 108 covers the top surface and the sidewalls of an upper portion of the second conductive pattern 107 and caps the air gap 111. Further, the barrier pattern 108 covers the sidewalls of the opening 103 over the air gap 111. The barrier pattern 108 does not fill the air gap 111 but caps the air gap 111. The barrier pattern 108 includes a meta containing material. The barrier pattern 108 may include titanium.

Figure 1B:
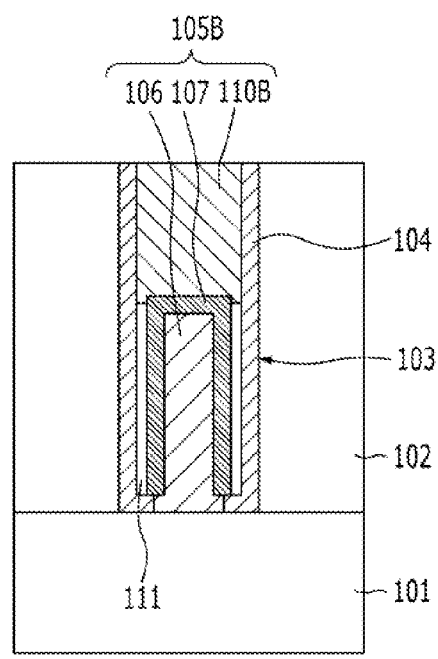
FIG. 1B is a cross-sectional view illustrating a semiconductor device in accordance with a modification of the first embodiment.

The glue pattern 109 includes a metal-containing material. The glue pattern 109 may include titanium nitride (TIN), FIG. 1B is a cross-sectional view illustrating a semiconductor device in accordance with a modification of the first embodiment. In FIGS. 1A and 1B, like reference numerals are used to refer to the same elements.

Referring to FIG. 1B, unlike FIG. 1A, the air gap 111 and the second conductive pattern 107 are capped by a third conductive pattern 110B without the barrier pattern 108 and the glue pattern 109 of FIG. 1A. A conductive structure 105S becomes a stack structure of the first conductive pattern 106, the second conductive pattern 107, and the third conductive pattern 110.

In FIGS. 1A and 1B, the conductive structure 105 and 105B may become a plug structure. The first conductive pattern 106 includes a silicon plug. The third conductive pattern 110 and 110B includes a metal plug. The second conductive pattern 107 serves as an ohmic contact layer between the silicon plug and the metal plug.

The conductive structure 105 and 105B including the silicon plug and the metal plug may be referred to as a semimetal plug (SMP).

Figure 1C:
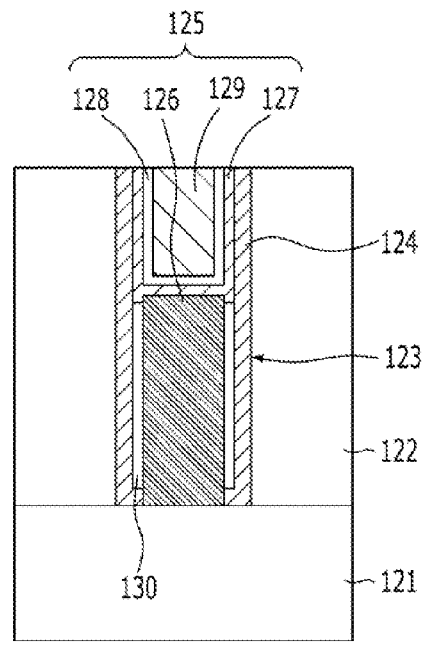
FIG. 1C is a cross-sectional view illustrating a semiconductor device in accordance with a second embodiment.

FIG. 1C is a cross-sectional view illustrating a semiconductor device in accordance with a second embodiment.

Referring to FIG. 1C, a dielectric layer 122 is formed on a substrate 121. An opening 123 is defined in the dielectric layer 122 to expose the surface of the substrate 121. A conductive structure 125 is formed in the opening 123. The conductive structure 125 includes a first conductive pattern 126 and a second conductive pattern 129. The second conductive pattern 129 is formed over the first conductive pattern 126. A barrier pattern 127 and a glue pattern 128 are formed between the first conductive pattern 126 and the second conductive pattern 129. An air gap 130 is defined between the first conductive pattern 126 and the sidewalls of the opening 123. The barrier pattern 127 caps the air gap 130 and covers the top surface and the sidewalls of an upper portion of the first conductive pattern 126. A spacer 124 may be formed on the sidewalls of the opening 123.

The first conductive pattern 126 includes silicide. The conductive pattern 126 may include metal silicide. The first conductive pattern 126 includes metal silicide which is formed by deposition. The metal silicide may be formed by chemical vapor deposition (CVD). The first conductive pattern 126 may also be formed by a fully-silicidation process. The first conductive pattern 126 may include titanium silicide, cobalt silicide, nickel silicide, or tungsten silicide. In the exemplary embodiment, the first conductive pattern 126 includes cobalt silicide. The first conductive pattern 126 includes cobalt silicide with the phase of $CoSi_2$.

Figure 1D:
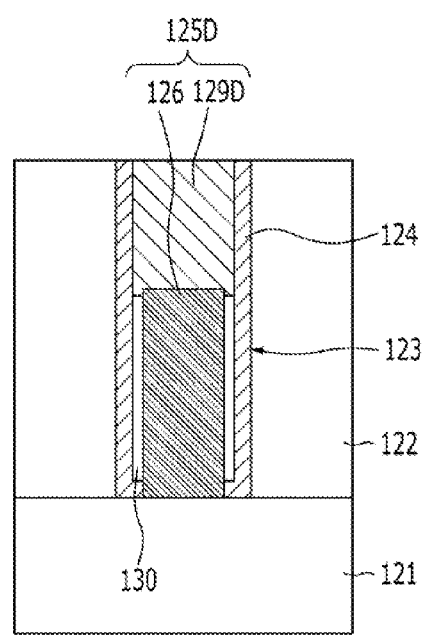
FIG. 1D is a cross-sectional view illustrating a semiconductor device in accordance with a modification of the second embodiment.

FIG. 1D is a cross-sectional view illustrating a semiconductor device in accordance with a modification of the second embodiment. In FIGS. 1C and 1D, like reference numerals are used to refer to the same elements.

Referring to FIG. 1D unlike FIG. 1C, the air gap 130 and the first conductive pattern 126 are capped by a second conductive pattern 129D without the barrier pattern 127 and the glue pattern 128 of FIG. 1C. A conductive structure 125D becomes a stack structure of the first conductive pattern 126 and the second conductive pattern 129.

In FIGS. 1C and 1D, the conductive structure 125 and 125D may become a plug structure. The first conductive pattern 126 includes a silicon plug. The second conductive pattern 129 includes a metal plug. The conductive structure 125 including the silicon plug and the metal plug may be referred to as a metal-base plug.

In FIGS. 1A to 1D, each of the conductive structures 105, 105B, 125, and 125D may include a bit line, a metal line, a gate electrode, a word line, a through electrode, or the like.

While not shown, a transistor which includes a gate electrode formed on the substrate 101 and 121, and a source region and a drain region formed in the substrate 101 and 121 may be formed. Each of the conductive structures 105, 105B, 125, and 125D may be connected to the source region or the drain region of the transistor. The transistor may include a planar gate type transistor, a trench gate type transistor, a buried gate type transistor, a recess gate type transistor, or a vertical channel transistor. An additional conductive structure may be formed on each of the conductive structures 105, 105B, 125, and 125D. The additional conductive structure may include a metal line or a memory element. The memory element may include a capacitor which is comprised of a storage node, a dielectric layer, and a plate node. The storage node may be electrically connected onto each of the conductive structures 105, 105B, 125, and 125D. The memory element may be constructed in a variety of ways. For example, the memory element may include a resistance variable material. The memory element may include a first electrode, a resistance variable material and a second electrode which are sequentially stacked, and the first electrode may be electrically connected to each of the conductive structures 105, 105B, 125, and 125D. Data may be stored by using the fact that the resistance of the resistance variable material is changed according to the voltages applied to the first electrode and the second electrode. The resistance variable material may include a phase change material or a magnetic tunnel junction.

FIGS. 2A to 2G are cross-sectional views illustrating an exemplary method for fabricating the semiconductor device in accordance with the first embodiment.

Figure 2A:
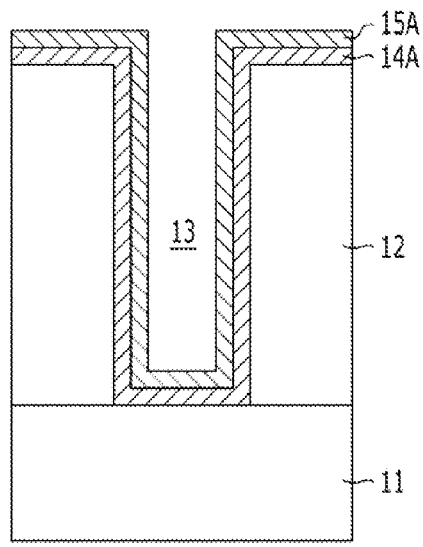
FIGS. 2A to 2G are cross-sectional views illustrating an exemplary method for fabricating the semiconductor device in accordance with the first embodiment.

Referring to FIG. 2A, a first dielectric layer 12 is formed on a substrate 11. The substrate 11 includes a semiconductor substrate. The substrate 11 may include a silicon substrate, a silicon germanium substrate, or an SOI substrate. The first dielectric layer 12 includes a low-k material. The first dielectric layer 12 may include silicon nitride or silicon oxide.

By etching the first dielectric layer 12, an opening 13 is defined in the first dielectric layer 12 to expose the surface of the substrate 11. The opening 13 has a hole shape or a line shape. The opening 13 may include a contact hole, a via hole, a through hole, a trench, a recess, or the like. A plurality of openings 13 may be formed in the first dielectric layer 12 at regular intervals to define an opening array. In order to etch the first dielectric layer 12, a mask pattern (not shown) may be used. The mask pattern Includes a photoresist pattern or a hard mask pattern that is patterned using a photoresist pattern. The surface of the substrate 11 which is exposed by the opening 13 may include an impurity region.

A second dielectric layer 14A is formed. The second dielectric layer 14A is formed over the first dielectric layer 12 including the opening 13. The second dielectric layer 14A is a material to be a liner or spacer. The second dielectric layer 14A is conformally formed with a thin thickness that does not fill the opening 13. The second dielectric layer 14A includes a low-k material. The second dielectric layer 14A may include silicon nitride or silicon oxide. For example, the first dielectric layer 12 may include silicon oxide, and the second dielectric layer 14A may include silicon nitride. In an alternative embodiment, the second dielectric layer 14A may be omitted.

A sacrificial layer 15A is formed on the second dielectric layer 14A. The sacrificial layer 15A is conformally formed on the second dielectric layer 14A with a thin thickness that does not fill the opening 13. The sacrificial layer 15A includes a material which may be removed by wet etching. The sacrificial layer 15A may include a material different from the first dielectric layer 12 and the second dielectric layer 14A. The sacrificial layer 15A includes metal nitride. The sacrificial layer 15A may include titanium nitride (TiN).

Figure 2B:
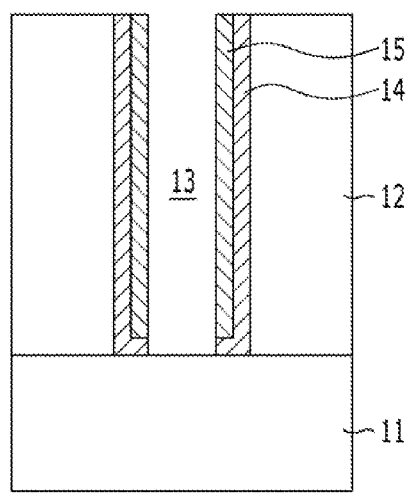

Referring to FIG. 2B, a spacer 14 and a sacrificial spacer 15 are formed on the sidewalls of the opening 13. The sacrificial spacer 15 is formed by etching the sacrificial layer 15A. The spacer 14 is formed by etching the second dielectric layer 14A. In order to form the spacer 14 and the sacrificial spacer 15, an etch-back process may be performed. The surface of the substrate 11 is exposed on the bottom of the opening 13 by forming the spacer 14 and the sacrificial spacer 15.

Figure 2C:
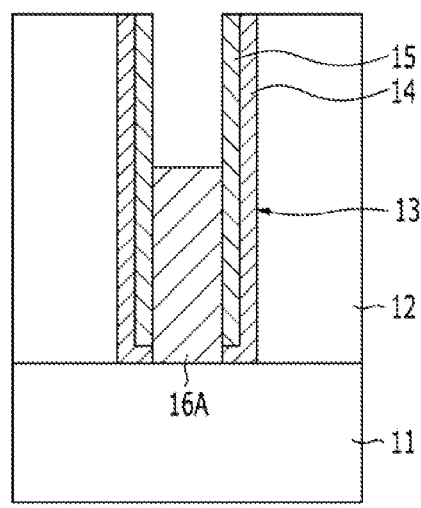

Referring to FIG. 2C, a first conductive pattern 16A is formed. The first conductive pattern 16A is formed in such a way as to be recessed in the opening 13. In detail, a first conductive layer (not shown) is formed over the first dielectric layer 12 including the sacrificial spacer 15 to fill the opening 13. By selectively removing the first conductive layer, the first conductive pattern 16A is formed in the opening 13. In order to form the first conductive pattern 16A, the first conductive layer may be etched by an etch-back process. The first conductive pattern 16A includes a silicidable material. The first conductive pattern 16A may include a silicon-containing layer. The first conductive pattern 16A may include polysilicon. The first conductive pattern 16A contacts the surface of the substrate 11. The first conductive pattern 16A is recessed to have a height that is lower than the top surface of the first dielectric layer 12. An upper portion of the sacrificial spacer 15 is exposed by forming the first conductive pattern 16A.

Figure 2D:
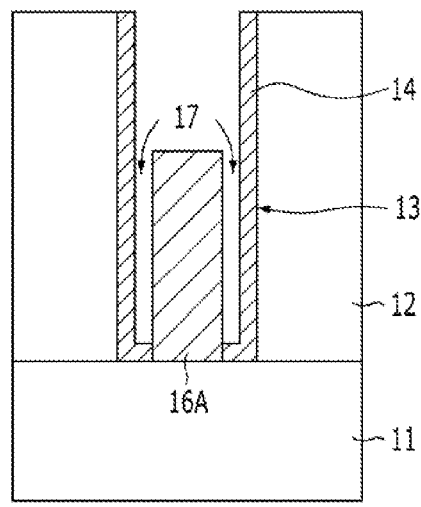

Referring to FIG. 2D, the sacrificial spacer 15 are removed. In order to remove the sacrificial spacer 15, a strip process is performed. The strip process may include a cleaning process. The cleaning process uses a wet chemical capable of removing the sacrificial spacer 15.

After the sacrificial spacer 15 is removed by the strip process, spaces occupied by the sacrificial spacer 15 remain as an air gap 17, The air gap 17 is defined between the first conductive pattern 16A and the sidewalls of the opening 13. Accordingly, a dielectric structure constituted by the air gap 17 and the spacer 14 is formed between the first conductive pattern 16A and the sidewalls of the opening 13. When the spacer 14 is omitted, a dielectric structure constituted by the air gap 17 is formed between the first conductive pattern 16A and the sidewalls of the opening 13.

Figure 2E:
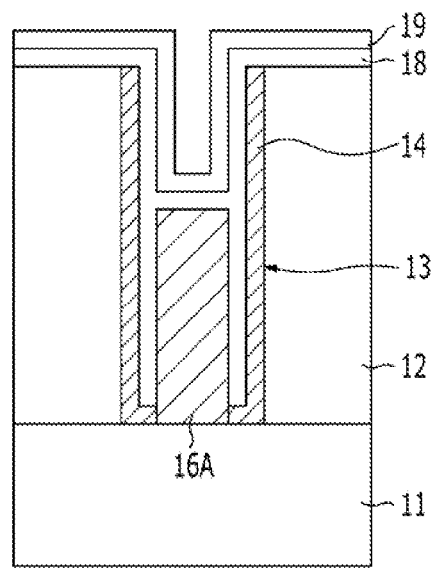

Referring to FIG. 2E, a silicidable layer 18 is formed. The silicidable layer 18 is formed over the entire surface of the resultant structure while covering the first conductive pattern 16A. The silicidable layer 18 is formed on the top surface and the sidewalls of the first conductive pattern 16A, which are exposed due to the air gap 17. The silicidable layer 18 may gap-fill in the air gap 17. The silicidable layer 18 includes a material capable of forming silicide on the top surface and the sidewalls of the first conductive pattern 16A. The silicidable layer 18 includes a silicidable metal. For example, the silicidable metal may include titanium, cobalt, tungsten or nickel. The silicidable layer 18 may be formed by CVD. Accordingly, the silicidable layer 18 is formed with a uniform thickness on the top surface and the sidewalls of the first conductive pattern 16A. The silicidable metals are all conductive materials.

Hereinafter, in the exemplary embodiment, the silicidable layer 18 includes cobalt.

A capping layer 19 is formed on the silicidable layer 18. The capping layer 19 is conformally formed. The capping layer 19 prevents a silicide layer to be subsequently formed, from being attacked. The capping layer 19 is formed by atomic layer deposition (ALD). The capping layer 19 includes metal nitride. The capping layer 19 includes a titanium-containing material. The capping layer 19 may include titanium nitride. The capping layer 19 may be formed by stacking titanium and titanium nitride. The capping layer 19 may be formed in the air gap 17 or may not be formed in the air gap 17. For example, when the silicidable layer 18 is formed without gap-filling the air gap 17, the capping layer 19 may be formed in the air gap 17. In the case when the silicidable layer 18 is formed to gap-fill the air gap 17, the capping layer 19 is not formed in the air gap 17.

According to the above descriptions, the silicidable layer 18 is formed to cover the top surface and the sidewalls of the first conductive pattern 16A. Therefore, because the contact area between the first conductive pattern 16A and the silicidable layer 18 increases, an area for forming a silicide layer to be subsequently formed increases.

Figure 2F:
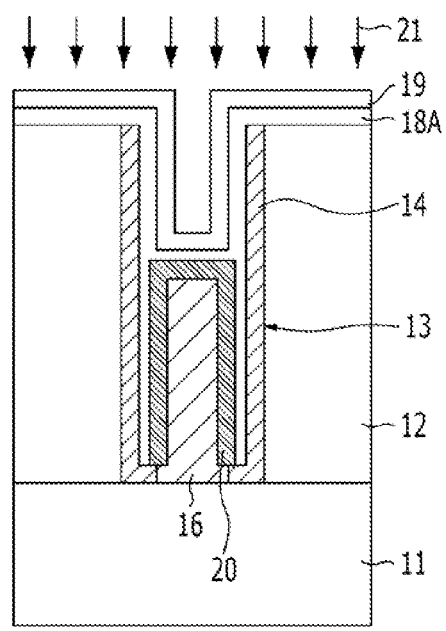

Referring to FIG. 2F, a second conductive pattern 20 is formed. In order to form the second conductive pattern 20, a thermal process may be performed. The thermal process includes an annealing process 21. The annealing process 21 is performed to make the first conductive pattern 16A and the silicidable layer 18 react with each other. Elaborating on this, a silicidation reaction occurs along the interface where the first conductive pattern 16A and the silicidable layer 18 contact each other. Accordingly, a silicide layer is formed. The silicide layer becomes the second conductive pattern 20. The second conductive pattern 20 serves as an ohmic contact layer. The annealing process 21 may be performed at a temperature of at least 200° C. The annealing process 21 includes a rapid thermal annealing (RTA) process.

As the annealing process 21 is performed, the silicon of the first conductive pattern 16A and the metal of the silicidable layer 18 react with each other, and a metal silicide layer is formed. The metal silicide layer may include titanium silicide, cobalt silicide, nickel silicide, or tungsten silicide. Since the first conductive pattern 16A includes polysilicon and the silicidable layer 18 includes cobalt, a cobalt silicide layer is formed by the annealing process 21.

For example, in order to form the cobalt silicide layer, the annealing process 21 may be performed twice. By a primary annealing process, cobalt silicide with a phase of $CoSi_x$ (x=0.1~1.5) is formed. A secondary annealing process is performed after the primary annealing process. The secondary annealing process may be performed at a temperature higher than the primary annealing process. The secondary annealing process is performed at a temperature ranging from approximately 600° C. to approximately 800° C. A phase change of the cobalt silicide layer occurs by the secondary annealing process. For example, a phase change to cobalt silicide with the phase of $CoSi_2$ occurs by the secondary annealing process. The resistivity of the cobalt silicide with the phase of $CoSi_2$ is lower than the cobalt silicide with the phase of $CoSi_x$ (x=0.1~1.5) By forming the cobalt silicide with the phase of $CoSi_2$, contact resistance may be reduced, and at the same time, it is possible to form cobalt silicide with a lower resistance even in the small area of the opening 13 with a fine line width. The secondary annealing process may be performed after removing an unreacted silicidable layer 18A.

Because the second conductive pattern 20 is formed by consuming the silicon of the first conductive pattern 16A, the first conductive pattern 16A may be reduced in its volume as indicated by the reference numeral '16'. After the annealing process 21, the first conductive pattern 16 is covered by the second conductive pattern 20.

As described above, the second conductive pattern 20 which covers the top surface and the sidewalls of the first conductive pattern 16 is formed by the annealing process 21. The second conductive pattern 20 serves as an ohmic contact layer between the first conductive pattern 16 and a third conductive pattern to be subsequently formed.

The unreacted silicidable layer 18A may remain on the second conductive pattern 20.

Figure 2G:
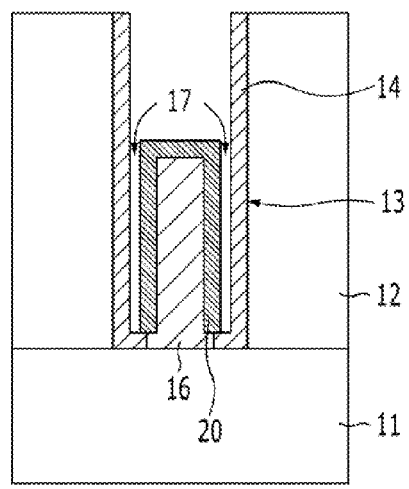

Referring to FIG. 2G, the unreacted silicidable layer 18A and the capping layer 19 are removed. In order to remove the unreacted silicidable layer 18A and the capping layer 19, a strip process is performed. The strip process includes a cleaning process using a wet chemical.

By the strip process, the unreacted silicidable layer 18A removed, and the air gap 17 is opened again. The volumes of the air gap 17 may be identical to or smaller than the initially defined air gap 17.

Figure 2H:
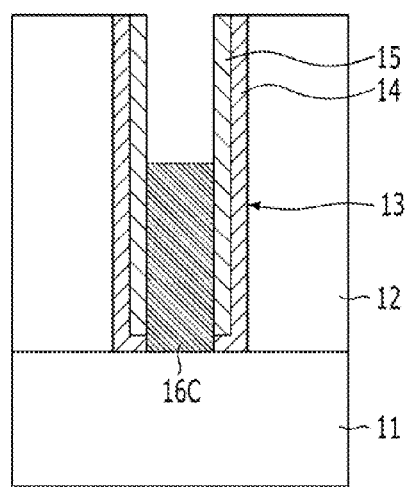
FIGS. 2H and 2I are cross-sectional views illustrating an exemplary method for fabricating the semiconductor device in accordance with the second embodiment.
Figure 2I:
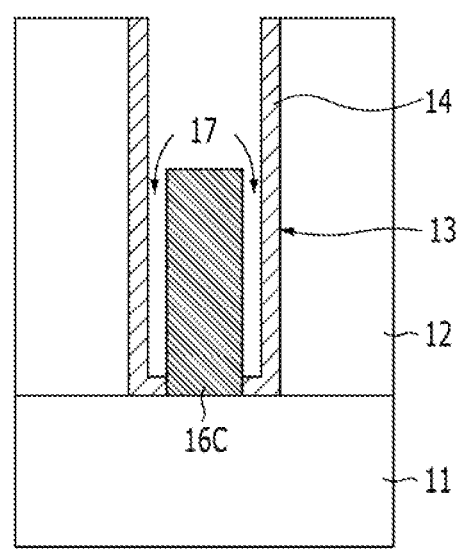

FIGS. 2H and 2I are cross-sectional views showing an exemplary method for fabricating the semiconductor device accordance with the second embodiment. In FIG. 2B and 2I, like reference numerals are used to refer to the same elements.

Referring to FIG. 2H, in a state that the spacer 14 and the sacrificial spacer 15 are formed on the sidewalls of the opening 13 as shown in FIG. 2B, a first conductive pattern 16C is formed in such a way as to be recessed in the opening 13. A first conductive pattern 16C may be formed by depositing and etching back a first conducive layer (not shown). The first conductive pattern 16C includes metal silicide. The first conductive pattern 16C may include titanium silicide, cobalt silicide, nickel silicide, or tungsten silicide. The first conductive layer is formed by CVD. In the exemplary embodiment, the first conductive pattern 16C includes cobalt silicide. The cobalt silicide includes cobalt silicide with the phase of $CoSi_2$. The first conductive pattern 16C contacts the surface of the substrate 11. The first conductive pattern 16C has a recessed surface lower than the top surface of the first dielectric layer 12. By forming the first conductive pattern 16C by depositing metal silicide, an annealing process and a strip process may be omitted.

Referring to FIG. 2I, the sacrificial spacer 15 is removed. The sacrificial spacer 15 is removed by a strip process, and spaces occupied by the sacrificial spacer 15 remain as the air gap 17.

The air gap 17 is defined between the first conductive pattern 16C and the sidewalls of the opening 13.

The first conductive pattern 16C according to the second embodiment may be formed by performing a fully-silicidation process when performing the annealing process 21 in FIG. 2F.

Figure 3A:
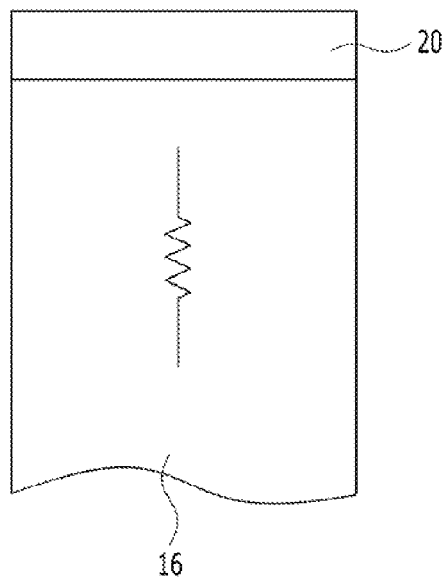
FIGS. 3A and 3B illustrate comparative examples of resistances according to a position of conductive structures.
Figure 3B:
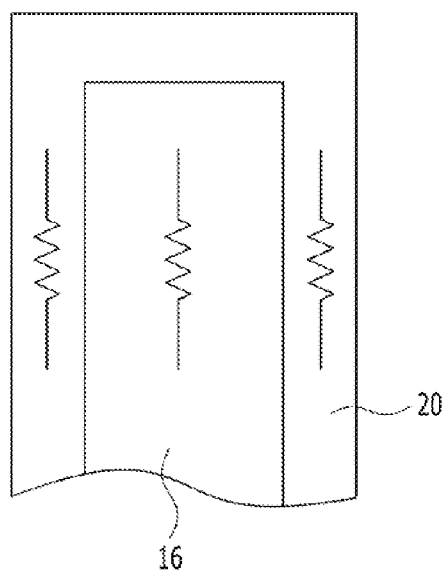

FIGS. 3A and 3B illustrate comparative examples of resistances according to a position of conductive structures. FIG. 3B illustrates the case in which the second conductive pattern 20 is formed to cover the top surface and the sidewalls of the first conductive pattern 16, in accordance with the first embodiment. FIG. 3A illustrates the case in which the second conductive pattern 20 is formed to cover only the top surface of the first conductive pattern 16.

Referring to FIG. 3B, by forming the second conductive pattern 20 to cover the top surface and the sidewalls of the first conductive pattern 16, the resistance of a conductive structure may be reduced by the parallel resistance law. Accordingly, the exemplary embodiments of the present invention may reduce the resistance of the conductive structure.

Figure 4A:
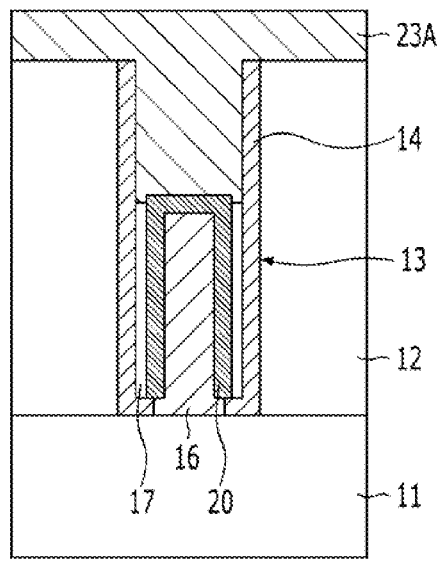
FIGS. 4A and 4B are cross-sectional views illustrating an exemplary method for capping an air gap in the semiconductor device in accordance with the first embodiment.
Figure 4B:
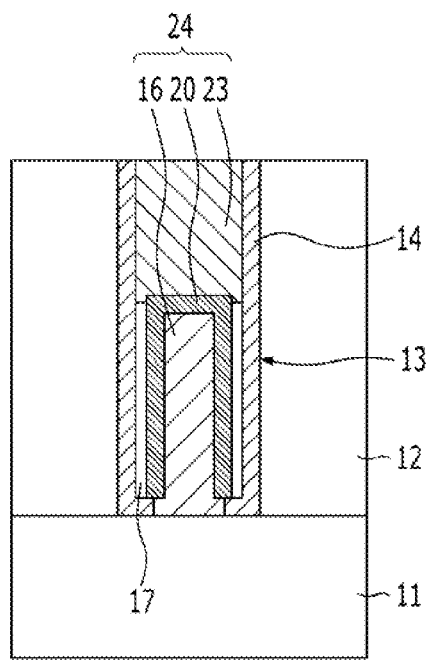

FIGS. 4A and 4B are cross-sectional views illustrating an exemplary method for capping the air gap in the semiconductor device in accordance with the first embodiment. In FIG. 2G and FIGS. 4A and 4B, like reference numerals are used to refer to the same elements.

Referring to FIG. 4A, a conductive layer 23A is formed. The conductive layer 23A is formed over the entire surface of the resultant structure shown in FIG. 2G. The air gap 17 is capped by the conductive layer 23A. Since the spaces of the air gap 17 are narrow, the air gap 17 may not be filled but be capped when forming the conductive layer 23A. The conductive layer 23A is formed to fill the remainder of the opening 13 on the second conductive pattern 20. Further, the conductive layer 23A may cover the top surface and the sidewalls of an upper portion of the second conductive pattern 20, The conductive layer 23A may include a metal-containing layer. The conductive layer 23A may include a tungsten layer.

Referring to FIG. 4B, a third conductive pattern 23 is formed.

In order to form the third conductive pattern 23, the conductive layer 23A may be selectively removed by an etchback process or a chemical mechanical polishing (CMP) process.

Accordingly, a conductive structure 24 including the first conductive pattern 16, the second conductive pattern 20, and the third conductive pattern 23 is formed in the opening 13. The air gap 17 is defined between the conductive structure 24 and the sidewalls of the opening 13. The second conductive pattern 20 forms an ohmic contact between the first conductive pattern 16 and the third conductive pattern 23. The air gap 17 is defined between the second conductive pattern 20 and the side ails of the opening 13. A dielectric structure including the air gap 17 and the spacer 14 is formed between the conductive structure 24 and the sidewalls of the opening 13.

Figure 5A:
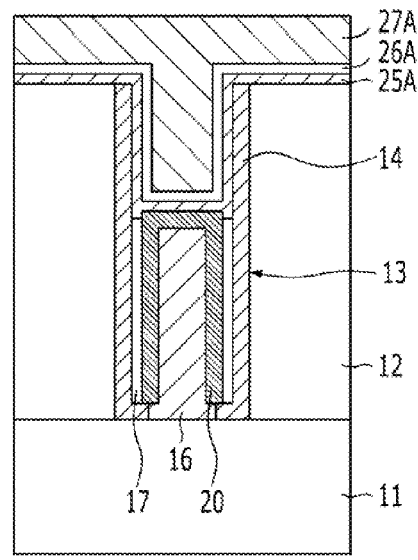
FIGS. 5A and 5B are cross-sectional views illustrating another exemplary method for capping an air gap in the semiconductor device in accordance with the first embodiment.
Figure 5B:
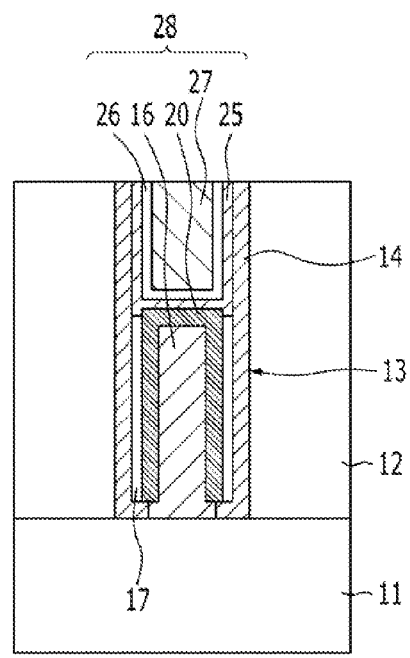

FIGS. 5A and 5B are cross-sectional views showing another exemplary method for capping the air gap in the semiconductor device in accordance with the first embodiment. In FIG. 2G and FIGS. 5A and 5B, like reference numerals are used to refer to the same elements.

Referring to FIG. 5A, a barrier layer 25A is formed. The barrier layer 25A is formed over the entire surface of the resultant structure shown in FIG. 2G. The barrier layer 25A is conformally formed with a thin thickness that does not fill the opening 13. The barrier layer 25A includes a conductive material. The barrier layer 25A caps the air gap 17. When forming the barrier layer 25A, a thickness is controlled not to fill but to cap the air gap 17. For example, the barrier layer 25A is formed by physical vapor deposition (PVD). By using PVD, the barrier layer 25A may be formed without filling the air gap 17. Also, by using PVD, the barrier layer 25A may be formed to remove native oxide which remains on the surface of the second conductive pattern 20. The barrier layer 25A may cover the top surface and the sidewalls of an upper portion of the second conductive pattern 20. Accordingly, as the contact area between the barrier layer 25A and the second conductive pattern 20 increases, contact resistance may be reduced. The barrier layer 25A includes a titanium-containing layer. The barrier layer 25A includes titanium.

By forming the barrier layer 25A, it is possible to cap the air gap 17 without filling the insides of the air gap 17.

A glue layer 26A is formed on the barrier layer 25A. The glue layer 26A includes a conductive material. The glue layer 26A includes a titanium-containing layer. The glue layer 26A may include titanium nitride (TiN). The glue layer 26A is formed by CVD.

A third conductive layer 27A is formed. The third conductive layer 27A fills the remainder of the opening 13 on the glue layer 26A. The third conductive layer 27A may include a metal-containing layer. The third conductive layer 27A may include a tungsten layer. The third conductive layer 27A is formed by CVD.

Referring to FIG. 5B, a third conductive pattern 27 is formed. The third conductive pattern 27 is formed by selectively removing the third conductive layer 27A shown in FIG. 5A. In order to form the third conductive pattern 27, an etching process or a planarization process may be performed. While forming the third conductive pattern 27, a glue pattern 26 and a barrier pattern 25 are formed. In order to form the glue pattern 26 and the barrier pattern 25, an etch-back process or a CMP process may be performed.

As the barrier pattern 25, the glue pattern 26 and the third conductive pattern 27 are formed, a conductive structure 28 is formed in the opening 13. The conductive structure 28 includes the first conductive pattern 16, the second conductive pattern 20, the barrier pattern 25, the glue pattern 26 and the third conductive pattern 27. The second conductive pattern 20 forms an ohmic contact between the first conductive pattern 16 and the third conductive pattern 27. The barrier pattern 25 caps the air gap 17. The glue pattern 26 increases the adhesion force between the second conductive pattern 20 and the third conductive pattern 27. The barrier pattern 25 and the glue pattern 26 prevent inter-diffusion between the second conductive pattern 20 and the third conductive pattern 27. The air gap 17 is defined between the second conductive pattern 20 and the sidewalls of the opening 13. A dielectric structure including the air gap 17 and the spacer 14 is formed between the conductive structure 28 and the sidewalls of the opening 13.

By the air gap capping methods shown in FIGS. 4B and 5B, the air gap 17 is capped by a conductive material which constitutes a part of the conductive structure 24 and 28. Thus, it is not necessary to cap the air gap 17 using spacer formed of a dielectric material, accordingly, a wide plugging area for the third conductive pattern 23 and 27 may be secured.

The conductive structure 24 and 28 may become a plug, an electrode, or the like. For example, when the conductive structure 24 and 28 is a plug, the conductive structure 24 and 28 may be constituted by a stack structure of a silicon plug, an ohmic contact layer, and a metal plug, and the air gap 17 is defined around the silicon plug. The first conductive pattern 16 becomes the silicon plug, the third conductive pattern 23 and 27 becomes the metal plug, and the second conductive pattern 20 becomes the ohmic contact layer. Further, the conductive structure 24 and 28 may become a bit line, a metal line, a gate electrode, a word line, a through electrode, or the like.

According to the first embodiment and the modification thereof, as the air gap 17 is defined, the electrical insulation characteristics of the conductive structure 24 and 28 may be improved. For example, in the case where another conductive pattern is disposed adjacent to the first conductive pattern 16, the parasitic capacitance between the two conductive patterns may be reduced.

Moreover, since the second conductive pattern 20 includes a silicide layer, the sheet resistance (Rs) of the conductive structure 24 and 28 may be reduced. In particular, since a low resistance silicide layer is included, the sheet resistance (Rs) of the conductive structure 24 and 28 may be further reduced. As the sheet resistance (Rs) is reduced, a contact resistance (Rc) may be improved.

Further, since the contact area between the first conductive pattern 16 and the second conductive pattern 20 increases, the contact resistance (Rc) of the conductive structure 24 and 28 may be further improved.

Furthermore, it is possible to cap the air gap 17 using a conductive material without using a dielectric material. As a consequence, a parasitic capacitance (Cb) may be reduced due to the air gap 17, a sheet resistance (Rs) may be reduced by the low resistance silicide layer, and the contact resistance (Rc) of the conductive structure 24 and 28 may be improved attributable to an increase in the contact area between the first conductive pattern 16 and the second conductive pattern 20.

Figure 6A:
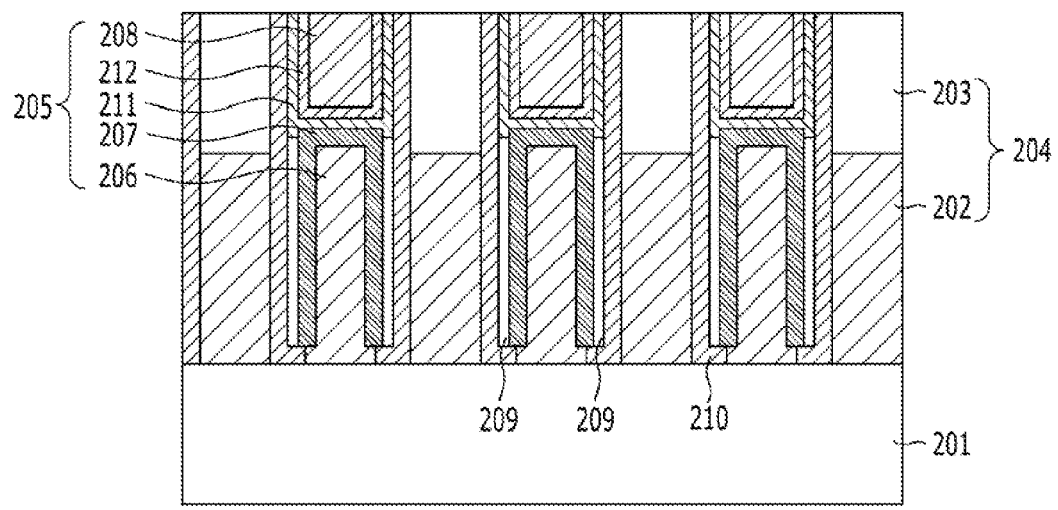
FIG. 6A is a cross-sectional view illustrating a semiconductor device in accordance with a third embodiment.

FIG. 6A is a cross-sectional view illustrating a semiconductor device in accordance with a third embodiment.

Referring to FIG. 6A a plurality of conductive structures are formed on a substrate 201. The conductive structures include first conductive structures 204 and second conductive structures 205. Dielectric structures with air gaps 209 are formed between the first conductive structures 204 and the second conductive structures 205. Spacers 210 are formed on the sidewalls of the first conductive structures 204. The air gaps 209 are defined between the spacers 210 and the second conductive structures 205. Each of the first conductive structures 204 includes a first conductive pattern 202 and a dielectric pattern 203 Each of the second conductive structures 205 includes a second conductive pattern 206, a third conductive pattern 207, a barrier pattern 211, a glue pattern 212, and a fourth conductive pattern 208. The third conductive patterns 207 and the air gaps 209 are capped by the barrier patterns 211. Dielectric structures including the air gaps 209 and the spacers 210 are formed between the third conductive patterns 207 and the first conductive patterns 202.

The substrate 201 may include a silicon substrate, a silicon germanium substrate, or an SOI substrate.

Each of the first conductive structures 204 includes the first conductive pattern 202. Each first conductive structure 204 may include a stack structure of the first conductive pattern 202 and the dielectric pattern 203. The first conductive pattern 202 may include a silicon-containing layer or a metal-containing layer. The first conductive pattern 202 may include a stack structure of a silicon-containing layer and a metal-containing layer. The first conductive pattern 202 may include polysilicon, metal, metal nitride, or metal silicide. The first conductive pattern 202 may include a stack structure of a polysilicon layer and a metal layer. The metal layer may include tungsten. The dielectric pattern 203 includes a dielectric material. The dielectric pattern 203 may include oxide or nitride. Each of the first conductive structures 204 has a line shape or a pillar shape.

Each of the second conductive structure 205 includes the second conductive pattern 206. The second conductive pattern 206 is formed in such a way as to be recessed between adjacent first conductive structures 204. The second conductive structure 205 may include a stack structure of the second conductive pattern 206, the third conductive pattern 207, the barrier pattern 211, the glue pattern 212, and the fourth conductive pattern 208. The height of the second conductive pattern 206 is identical to or larger than the first conductive pattern 202. An interlayer dielectric layer (not shown) which has openings between adjacent first conductive structures 204 may be formed, and the second conductive structures 205 may be formed in the openings. Each of the openings may have a shape which exposes the sidewalls of adjacent first conductive structures 204. The third conductive pattern 207 covers the top surface and the sidewalls of the second conductive pattern 206. The air gaps 209 are defined between the third conductive patterns 207 and the first conductive patterns 202. The third conductive patterns 207 and the air gaps 209 are capped by the barrier patterns 211. The second conductive pattern 206 includes a silicon-containing material. The second conductive pattern 206 may include polysilicon. The fourth conductive pattern 208 includes a metal-containing material. The fourth conductive pattern 208 may include tungsten. The third conductive pattern 207 includes silicide. The third conductive pattern 207 may include metal silicide. For instance, the third conductive pattern 207 may include titanium silicide, cobalt silicide, nickel silicide, or tungsten silicide. In the exemplary embodiment, the third conductive pattern 207 includes cobalt silicide. The third conductive pattern 207 includes cobalt silicide with a phase of $CoSi_2$. Each of the barrier patterns 211 covers the top surface and the sidewalls of an upper portion of the third conductive pattern 207 and caps the air gaps 209. The barrier pattern 211 does not fill the air gaps 209 but caps the air gaps 209. The barrier patterns 211 cover the sidewalls of the first conductive structures 204 over the air gaps 209. The barrier patterns 211 include a metal-containing material. The barrier patterns 211 may include titanium. The glue patterns 212 include a metal-containing material. The glue patterns 212 may include titanium nitride (TiN). Each of the second conductive structures 205 has a line shape or a pillar shape.

The spacers 210 are formed on the sidewalls of the first conductive structures 204. The spacers 210 include a low-k material.

The low-k material includes oxide or nitride. The spacers 210 may include silicon oxide, silicon nitride or metal oxide.

The air gaps 209 may be defined by removing a sacrificial material formed between the third conductive patterns 207 and the spacers 210.

Figure 6B:
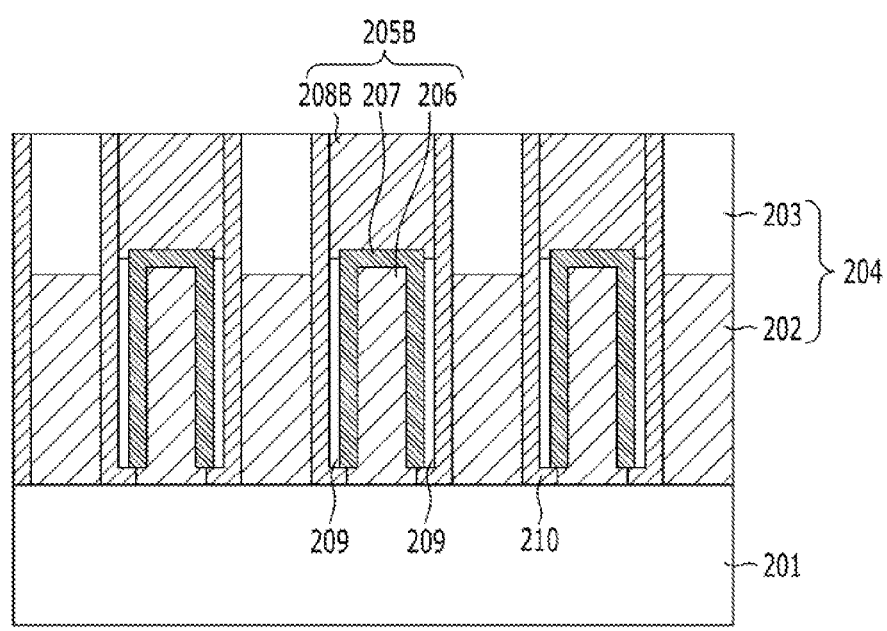
FIG. 6B is a cross-sectional view illustrating a semiconductor device in accordance with a modification of the third embodiment.

FIG. 6B is a cross-sectional view illustrating a semiconductor device in accordance with a modification of the third embodiment. In FIGS, 6A and 6B, like reference numerals are used to refer to the same elements.

Referring to FIG. 6B, unlike FIG. 6A, the air gaps 209 and the third conductive patterns 207 are capped by fourth conductive patterns 208B without the barrier patterns 211 and the glue patterns 212 of FIG. 6A. Each of second conductive structures 205B becomes a stack structure of the second conductive pattern 206, the third conductive pattern 207, and the fourth conductive pattern 208B.

In FIGS. 6A and 6B, any one conductive structure of the first conductive structure 204 and the second conductive structure 205 and 205B may have a line shape which extends in any one direction. The other conductive structure may have a pillar shape. For example, the first conductive structure 204 has a line shape, and the second conductive structure 205 and 205B has a pillar shape. The pillar shape may become a plug structure. The first conductive structure 204 includes a bit line, a metal line or a word line, and the second conductive structure 205 and 205B includes a contact plug, The contact plug may include a storage node contact plug, a landing plug, or a metal contact plug. For example, the first conductive structure 204 may become a bit line structure, and the second conductive structure 205 and 205B may become a storage node contact plug. In the second conductive structure 205 and 205B, the second conductive pattern 206 includes a silicon plug. The fourth conductive pattern 208 and 208B includes a metal plug. The third conductive pattern 207 becomes an ohmic contact layer between the silicon plug and the metal plug. The second conductive structure 205 and 205B including the silicon plug and the metal plug may be referred to as a semi-metal plug (SMP).

Figure 6C:
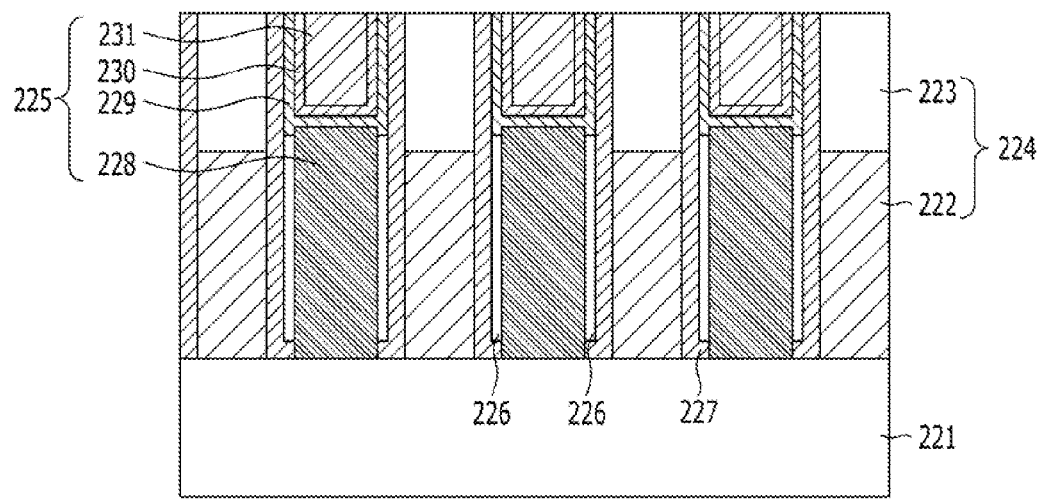
FIG. 6C is a cross-sectional view illustrating a semiconductor device in accordance with a fourth embodiment.

FIG. 6C is a cross-sectional view illustrating a semiconductor device in accordance with a fourth embodiment.

Referring to FIG. 6C, a plurality of conductive structures are formed on a substrate 221. The conductive structures include first conductive structures 224 and second conductive structures 225. Dielectric structures with air gaps 226 are formed between the first conductive structures 224 and the second conductive structures 225. Spacers 227 are formed on the sidewalls of the first conductive structures 224. The air gaps 226 are defined between the spacers 227 and the second conductive structures 225. Each of the first conductive structures 224 includes a first conductive pattern 222 and a dielectric pattern 223. Each of the second conductive structures 225 includes a second conductive pattern 228, a barrier pattern 229, a glue pattern 230, and a third conductive pattern 231. The second conductive patterns 228 and the air gaps 226 are capped by the barrier patterns 229. Dielectric structures including the air gaps 226 and the spacers 227 are formed between second conductive patterns 228 and the first conductive patterns 222.

The second conductive patterns 228 include silicide. The second conductive patterns 228 may include metal silicide. The second conductive patterns 228 include metal silicide which is formed by deposition. The metal silicide may be formed by CVD. The second conductive patterns 228 may include metal silicide which is formed by a fully-silicidation process. The second conductive patterns 228 may include titanium silicide, cobalt silicide, nickel silicide, or tungsten silicide. In the exemplary embodiment, the second conductive patterns 228 include cobalt silicide. The second conductive patterns 228 include cobalt silicide with the phase of $CoSi_2$.

Figure 6D:
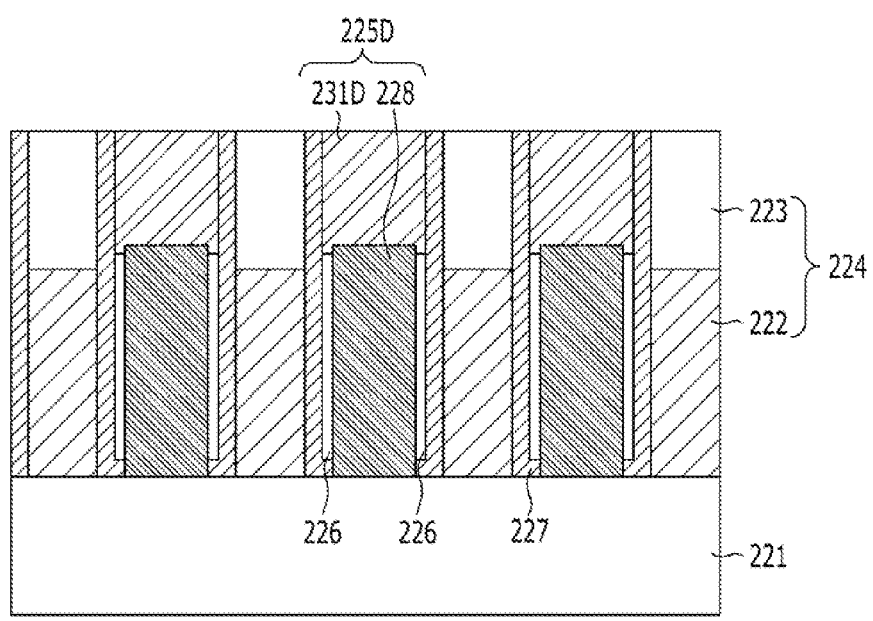
FIG. 6D is a cross-sectional view illustrating a semiconductor device in accordance with a modification of the fourth embodiment.

FIG. 6D is a cross-sectional view illustrating a semiconductor device in accordance with a modification of the fourth embodiment. In FIGS. 6C and 6D, like reference numerals are used to refer to the same elements.

Referring to FIG. 6D, unlike FIG. 6C, the air gaps 226 and the second conductive patterns 228 are capped by third conductive patterns 231D without the barrier patterns 229 and the glue patterns 230 of FIG. 6C. Each of second conductive structures 225 becomes a stack structure of the second conductive pattern 228 and the third conductive pattern 231D.

In FIGS. 6C and 6D, the second conductive structures 225 may become plug structures. The second conductive patterns 228 include silicide plugs. The third conductive patterns 231 include metal plugs. The second conductive structures 225 including the silicide plugs and the metal plugs may be referred to as metal-base plugs.

While not shown, in each of the semiconductor devices shown in FIGS. 6A to 6D, a transistor which includes a gate electrode formed on the substrate 201 and 221 and a source region and a drain region formed in the substrate 201 and 221 may be formed. Each of the second conductive structures 205, 205B, 225, and 225D may be connected to the source region or the drain region of the transistor.

The transistor may include a planar gate type transistor, a trench gate type transistor, a buried gate type transistor, a recess gate type transistor, or a vertical channel transistor. An additional conductive structure may be formed on each of the second conductive structures 205, 205B, 225, and 225D. The additional conductive structure may include a metal line or a memory element.

FIGS. 7A to 7I are cross-sectional views showing an exemplary method for fabricating the semiconductor device in accordance with the third embodiment.

Figure 7A:
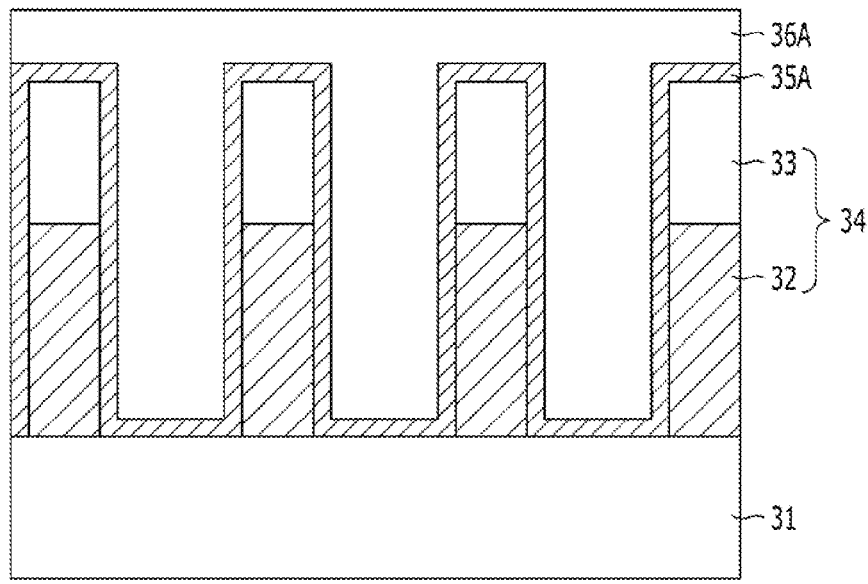
FIGS. 7A to 7I are cross-sectional views illustrating an exemplary method for fabricating the semiconductor device in accordance with the third embodiment.

Referring to FIG. 7A, a plurality of first conductive structures 34 are formed on a substrate 31. The substrate 31 includes a semiconductor substrate. The substrate 31 may include a silicon substrate, a silicon germanium substrate, or an SOI substrate.

The plurality of first conductive structures 34 is disposed at regular intervals. Each of the first conductive structures 34 may have a line shape. In order to form the first conductive structures 34, hard mask patterns 33 are formed on a first conductive layer (not shown). By etching the first conductive layer using the hard mask patterns 33 as an etch mask, first conductive patterns 32 are formed, In each of the first conductive structures 34, the first conductive pattern 32 and the hard mask pattern 33 are stacked and formed. The first conductive patterns 32 include a silicon-containing layer or a metal-containing layer. For example, the first conductive patterns 32 may include polysilicon or tungsten. The first conductive patterns 32 may be formed by stacking a silicon-containing layer and a metal-containing layer. For example, the first conductive patterns 32 may be formed by stacking a polysilicon layer and a tungsten layer. A barrier layer (not shown) may be formed between the polysilicon layer and the tungsten layer. The first conductive patterns 32 may include a stack structure of a polysilicon layer, a titanium layer and a tungsten layer. The titanium layer as the barrier layer may be formed by stacking titanium (Ti) and titanium nitride (TiN). The hard mask patterns 33 are formed using a dielectric material, A first dielectric layer 35A is formed on the plurality of first conductive structures 34. The first dielectric layer 35A includes a low-k material. The first dielectric layer 35A includes nitride or oxide. For instance, the first dielectric layer 35A may include silicon nitride or silicon oxide. The first dielectric layer 35A is conformally formed on the entire surface of the resultant structure including the first conductive structures 34. The first dielectric layer 35A is a material which will become spacers.

A second dielectric layer 36A is formed on the first dielectric layer 35A. The second dielectric layer 36A may include silicon oxide. The second dielectric layer 36A may be formed on the first dielectric layer 35A in such a way as to fill the spaces between the first conductive structures 34. The second dielectric layer 36A becomes an interlayer dielectric layer.

Figure 7B:
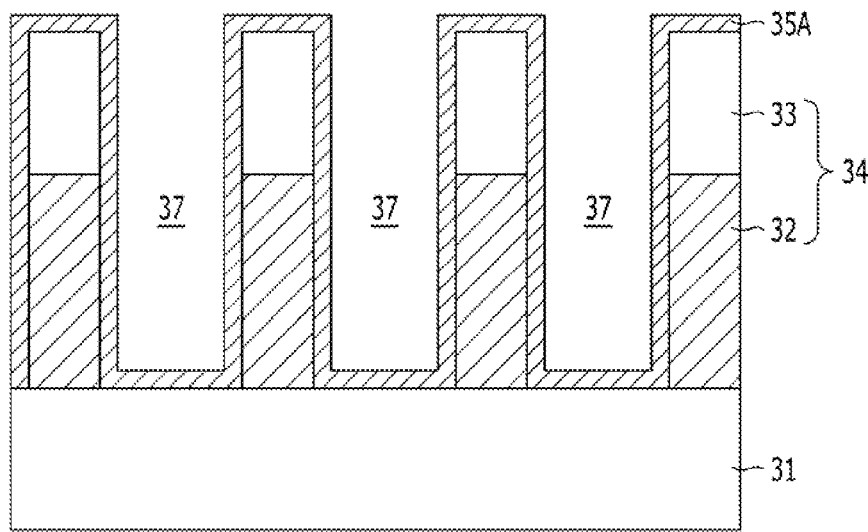

Referring to FIG. 7B, the second dielectric layer 36A is planarized. The second dielectric layer 36A may be planarized such that the surface of the first dielectric layer 35A on the first conductive structures 54 is exposed.

Openings 37 are defined in the second dielectric layer 36A which has been planarized. The openings 37 are defined by etching the planarized second dielectric layer 36A shown in FIG. 7A. To define the openings 37, mask patterns (not shown) may be used. Each of the openings 37 may have a hole shape or a line shape. A plurality of openings 37 may be defined at regular intervals in such a way as to define an opening array. Each of the openings 37 may be formed between adjacent first conductive structures 34. Through the openings 37, the first dielectric layer 35A formed on the sidewalls of the first conductive structures 34 may be exposed. In order to define the openings 37, the second dielectric layer 36A may be etched by being aligned with the first conductive structures 34 and the first dielectric layer 35A.

The first dielectric layer 35A may remain on the substrate 31 on the bottoms of the openings 37.

Figure 7C:
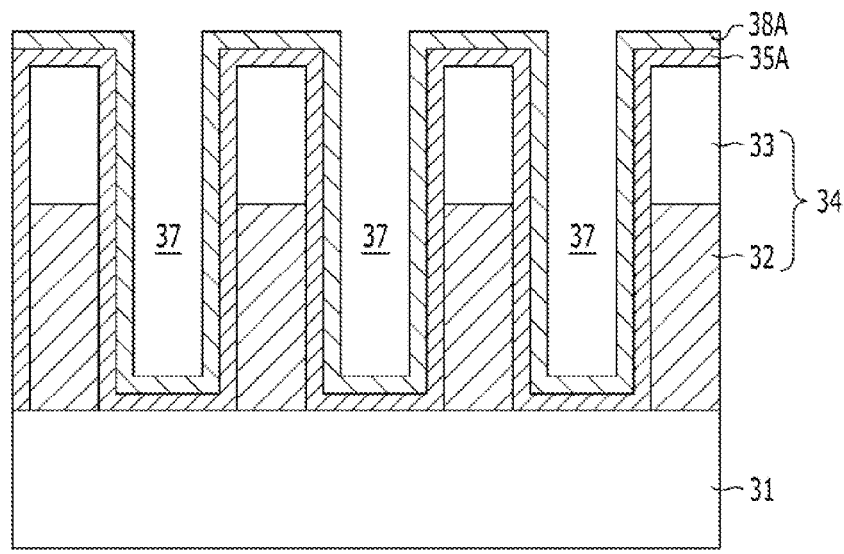

Referring to FIG. 7C, a sacrificial layer 38A is formed over the entire surface of the resultant structure which is defined by the openings 37. The sacrificial layer 38A is conformally formed on the first dielectric layer 35A without filling the opening 37. The sacrificial layer 38A includes a material which may be removed by wet etching. The sacrificial layer 38A may include metal nitride. The sacrificial layer 38A may include titanium nitride (TiN).

In an alternative embodiment, after defining the openings 37, the first dielectric layer 35A and the sacrificial layer 38A may be sequentially formed. Accordingly, the first dielectric layer 35A and the sacrificial layer 38A are formed to cover the surface of exposed portions of the substrate 31, the sidewalls of the openings 37, and the top surfaces of the hard mask patterns 33.

Figure 7D:
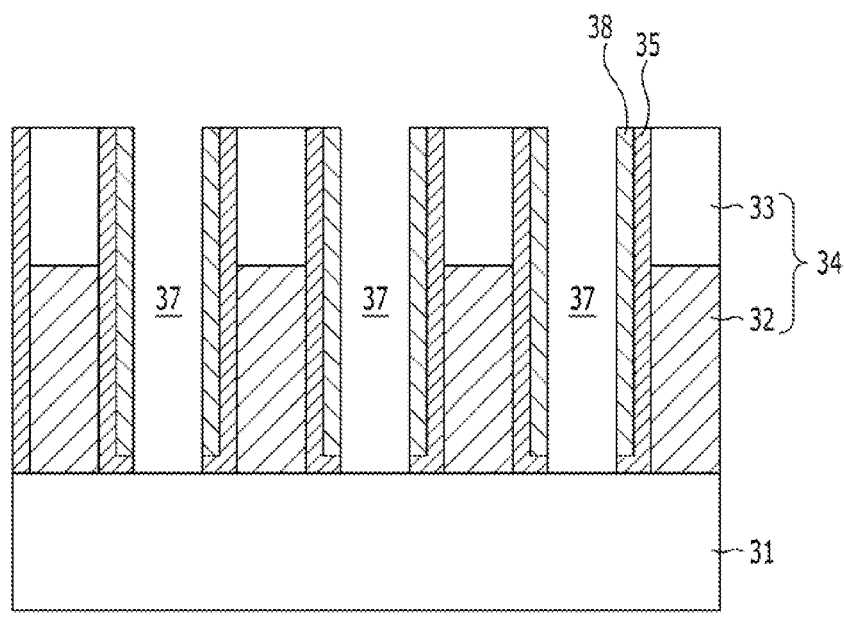

Referring to FIG. 7D, spacers 35 and sacrificial spacers 38 are formed on the sidewalls of the openings 37. The sacrificial spacers 38 are formed by etching the sacrificial layer 38A. The spacers 35 are formed by etching the first dielectric layer 35A. In order to form the spacers 35 and the sacrificial spacers 38, an etch-back process may be performed. The spacers 35 are formed on the sidewalls of the first conductive structures 34. The sacrificial spacers 38 are formed on the sidewalls of the spacers 35. By forming the spacers 35, the surface of portions of the substrate 31 are exposed between the first conductive structures 34. The sacrificial spacers 38 are formed on the sidewalls of the openings 37.

Figure 7E:
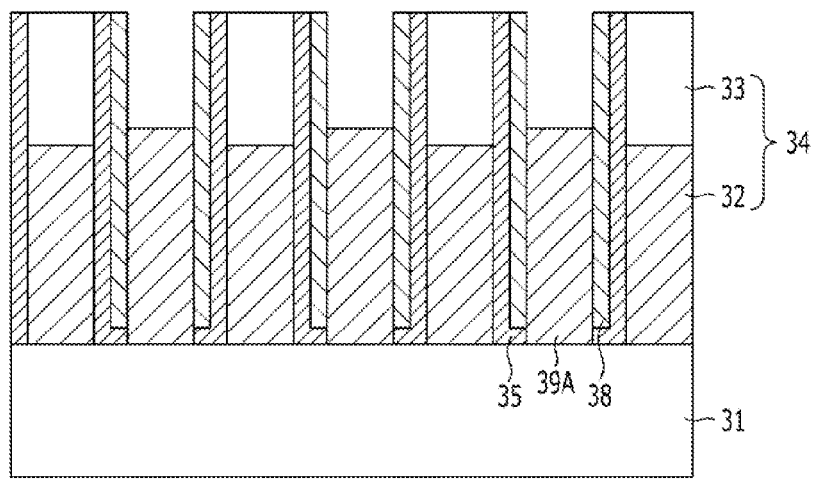

Referring to FIG. 7E, second conductive patterns 39A are formed. The second conductive patterns 39A are formed in such a way as to be recessed in the openings 37. In detail, a second conductive layer (not shown) is formed on the entire surface of the resultant structure including the sacrificial spacers 38. The second conductive layer is formed in such a way as to fill the openings 37. By selectively removing the second conductive layer, the second conductive patterns 39A are formed in the openings 37. In order to form the second conductive patterns 39A, the second conductive layer may be etched by an etch-back process. The second conductive patterns 39A include a silicidable material. The second conductive patterns 39A may include a silicon-containing layer. The second conductive patterns 39A may include polysilicon. The second conductive patterns 39A contact the surface of the exposed portions of the substrate 31. The second conductive patterns 39A are recessed to have the top surface lower than the top surface of the first conductive structures 34. The recessed surface of the second conductive patterns 39A may be controlled to be higher than the top surface of the first conductive patterns 32. Each of the second conductive patterns 39A may have a height to minimize an area between each second conductive pattern 39A and each first conductive pattern 32 arranged opposite one another. Accordingly, the parasitic capacitance between the first conductive pattern 32 and the second conductive pattern 39A may be reduced.

Figure 7F:
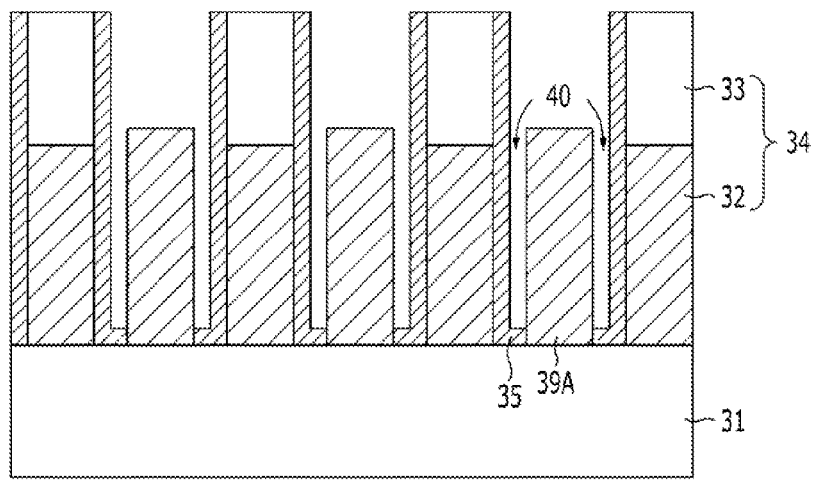

By forming the second conductive patterns 39A to be recessed in the openings 37 between the first conductive structures 34, portions of the sacrificial spacers 38 are exposed, Referring to FIG. 7F, the sacrificial spacers 38 are removed. In order to remove the sacrificial spacers 38, a strip process is performed. The strip process may include a cleaning process. The cleaning process uses a wet chemical capable of removing the sacrificial spacers 38.

After the sacrificial spacers 38 are removed by the strip process, and the spaces occupied by the sacrificial spacers 38 remain as air gaps 40. The air gaps 40 are defined between the second conductive patterns 39A and the sidewalls of the openings 37. Accordingly, dielectric structures constituted by the air gaps 40 and the spacers 35 are formed between the second conductive patterns 39A and the sidewalls of the openings 37.

Figure 7G:
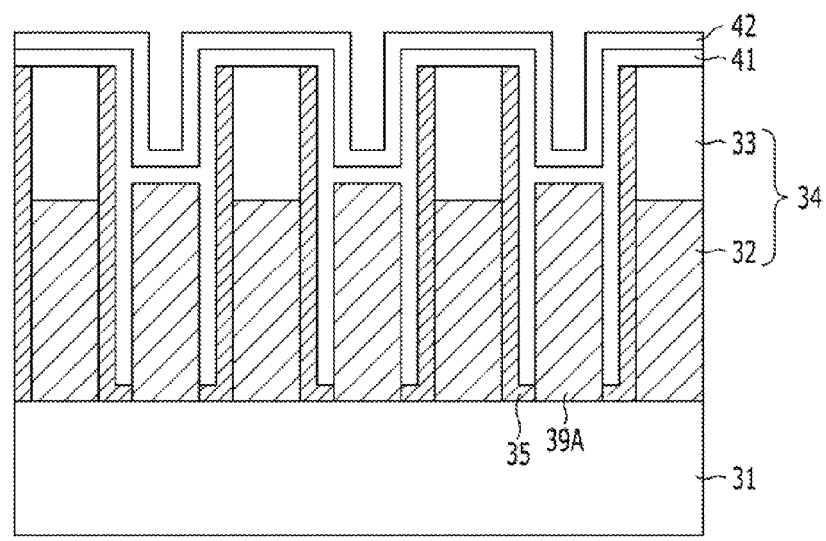

Referring to FIG. 7G, a silicidable layer 41 is formed. The silicidable layer 41 is formed over the entire surface of the resultant structure while covering the second conductive patterns 39A. The silicidable layer 41 is formed on the top surfaces and the sidewalls of the second conductive patterns 39A which are exposed due to the air gaps 40. The silicidable layer 41 may gap-fill the air gaps 40. The silicidable layer 41 includes a material capable of forming suicide on the top surfaces and the sidewalls of the second conductive patterns 39A. The silicidable layer 41 includes a silicidable metal. For example, the silicidable metal may include titanium, cobalt, tungsten, or nickel. The silicidable layer 41 may be formed by CVD. Accordingly, the silicidable layer 41 is formed with a uniform thickness on the top surfaces and the sidewalls of the second conductive patterns 39A. The silicidable metals are all conductive materials.

Hereinafter, in the exemplary embodiment, the silicidable layer 41 includes cobalt.

A capping layer 42 is formed on the silicidable layer 41. The capping layer 42 is conformally formed. The capping layer 42 prevents a silicide layer to be subsequently formed, from being attacked. The capping layer 42 is formed by atomic layer deposition (ALD). The capping layer 42 includes metal nitride. The capping layer 42 includes a titanium-containing material. The capping layer 42 may include titanium nitride (TiN). The capping layer 42 may be formed by stacking titanium and titanium nitride. The capping layer 42 may be formed in the air gaps 40 or may not be formed in the air gaps 40. For example, when the silicidable layer 41 is formed without gap-filling the air gaps 40, the capping layer 42 may be formed in the air gaps 40. In the case when the silicidable layer 41 is formed to gap-fill the air gaps 40 the capping layer 42 is not formed in the air gaps 40.

According to the above descriptions, the silicidable layer 41 is formed to cover the top surfaces and the sidewalls of the second conductive patterns 39A. Therefore, because the contact area between each second conductive pattern 39A and the silicidable layer 41 increases, an area for forming a silicide layer to be subsequently formed increases.

Figure 7H:
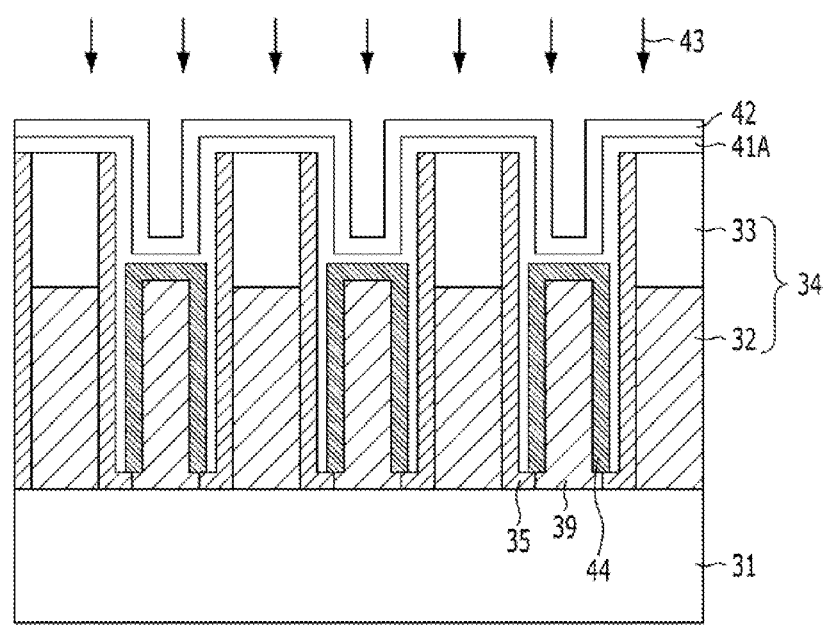

Referring to FIG. 7H, third conductive patterns 44 are formed. In order to form the third conductive patterns 44, a thermal process may be performed. The thermal process includes an annealing process 43. The annealing process 43 is performed to make the second conductive patterns 39A shown in FIG. 7G and the silicidable layer 41 react with each other. A silicidation reaction occurs along the interface where the second conductive patterns 39A and the silicidable layer 41 contact each other. Accordingly a silicide layer is formed. The silicide layer becomes the third conductive patterns 44. The third conductive patterns 44 serve as an ohmic contact layer. The annealing process 43 may be performed at a temperature of at least 200° C. The annealing process 43 includes a rapid thermal annealing (RTA) process.

As the annealing process 43 is performed, the silicon of the second conductive patterns 39A and the metal of the silicidable layer 41 react with each other, and a metal silicide layer is formed. The metal silicide layer may include titanium silicide, cobalt silicide, nickel silicide, or tungsten silicide. Since the second conductive patterns 39A include polysilicon and the silicidable layer 41 includes cobalt, a cobalt silicide layer is formed by the annealing process 43.

In order to form the cobalt silicide layer, the annealing process 43 may be performed twice. By a primary annealing process, cobalt silicide with a phase of $CoSi_x$ ($x$=0.1~1.5) is formed. A secondary annealing process is performed after the primary annealing process. The secondary annealing process may be performed at a temperature higher than the primary annealing process. The secondary annealing process is performed at a temperature ranging from approximately 600° C. to approximately 800° C. A phase change of the cobalt silicide layer occurs by the secondary annealing process. For example, a phase change to cobalt silicide with the phase of $CoSi_2$ occurs by the secondary annealing process. The resistivity of the cobalt silicide with the phase of $CoSi_2$ is lower than the cobalt silicide with the phase of $CoSi_x$ ($x$=0.1~1.5). By forming the cobalt silicide with the phase of $CoSi_2$, contact resistance may be reduced, and at the same time, it is possible to form cobalt silicide with a lower resistance even in the small area of each opening 37 with a fine line width. The secondary annealing process may be performed after removing an unreacted silicidable layer 41A.

Because the third conductive patterns 44 are formed by consuming the silicon of the second conductive patterns 39A, the second conductive patterns 39A may be reduced in their volumes as indicated by the reference numeral 39. After the annealing process 43, the second conductive patterns 39 are covered by the third conductive patterns 44.

As described above, the third conductive patterns 44 which cover the top surfaces and the sidewalls of the second conductive patterns 39 are formed by the silicidation reaction. The third conductive patterns 44 serve as an ohmic contact layer between the second conductive patterns 39 and fourth conductive patterns to be subsequently formed.

The unreacted silicidable layer 41A may remain on the third conductive patterns 44.

Figure 7I:
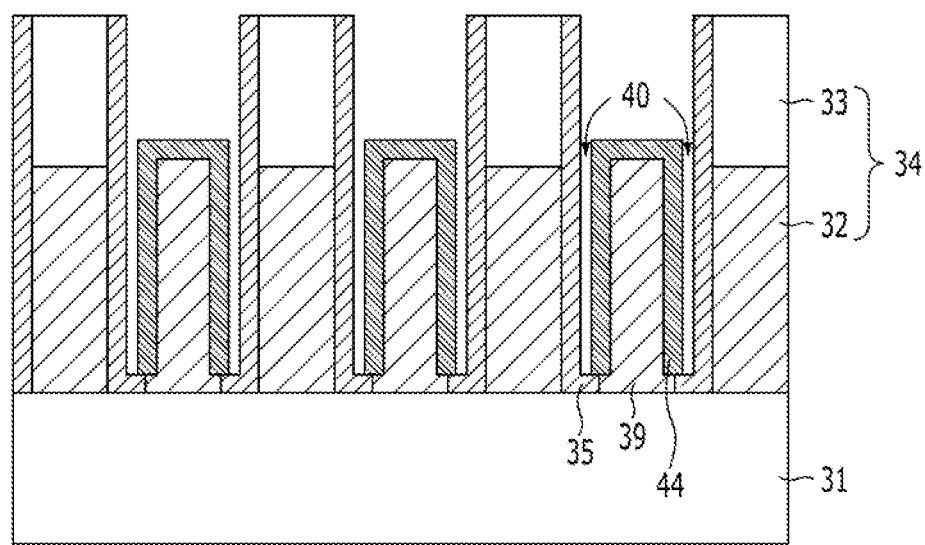

Referring to FIG. 7I, the unreacted silicidable layer 41A and the capping layer 42 are removed. In order to remove the unreacted silicidable layer 41A and the capping layer 42, a strip process is performed. The strip process includes a cleaning process using a wet chemical.

By the strip process, the unreacted silicidable layer 41A is removed. Accordingly, the air gaps 40 are opened again. Since the air gaps 40 are defined between the third conductive patterns 44 and the sidewalls of the openings 37, dielectric structures constituted by the air gaps 40 and the spacers 35 are formed between the third conductive patterns 44 and the sidewalls of the openings 37. The volumes of the air gaps 40 may be identical to or smaller than the initially defined air gaps 40.

Figure 8:
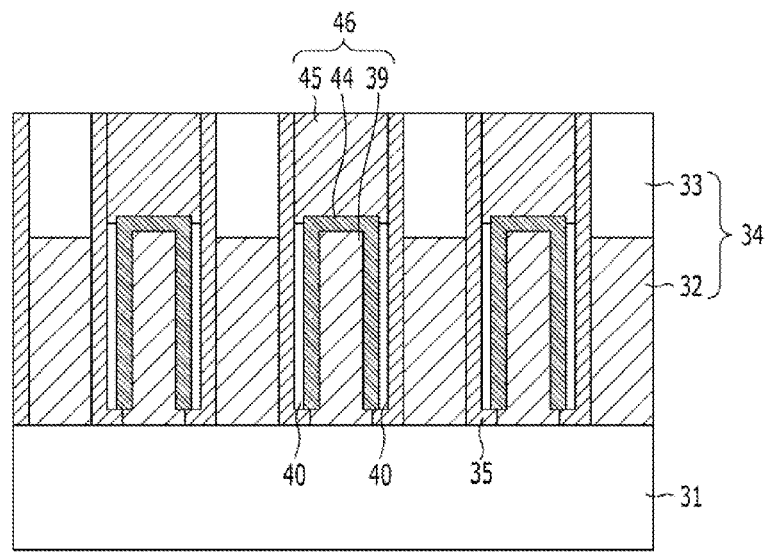
FIG. 8 is a cross-sectional view illustrating an exemplary method for capping air gaps in the semiconductor device in accordance with the third embodiment.

FIG. 8 is a cross-sectional view illustrating an exemplary method for capping the air gaps in the semiconductor device in accordance with the third embodiment. In FIG. 7I and FIG. 8, like reference numerals are used to refer to the same elements.

Referring to FIG. 8, fourth conductive patterns 45 are formed. The air gaps 40 and the third conductive patterns 44 are capped by the fourth conductive patterns 45. The fourth conductive patterns 45 cap the air gaps 40 and cover the top surfaces of the third conductive patterns 44. Since the spaces of the air gaps 40 are narrow, the air gaps 40 may not be filled but be capped when forming the fourth conductive patterns 45. The fourth conductive patterns 45 are formed to fill the remainders of the openings 37 on the third conductive patterns 44. Further, the fourth conductive patterns 45 may cover the top surfaces and the sidewalls of the upper portion of the third conductive patterns 44. The fourth conductive patterns 45 may include a metal-containing layer. The fourth conductive patterns 45 may include a tungsten layer. In order to form the fourth conductive patterns 45, a fourth conductive layer (not shown) may be deposited and planarized.

Accordingly, second conductive structures 46 are formed in the openings 37. Each of the second conductive structures 46 includes the second conductive pattern 39, the third conductive pattern 44, and the fourth conductive pattern 45. The third conductive pattern 44 forms an ohmic contact between the second conductive pattern 39 and the fourth conductive pattern 45. The air gaps 40 are defined between the third conductive patterns 44 and the sidewalls of the openings 37. When the openings 37 are self-aligned with the sidewalls of the first conductive structures 34, the air gaps 40 may be defined between the third conductive patterns 44 and the first conductive patterns 32. Dielectric structures including the air gaps 40 and the spacers 35 are formed between the second conductive structures 46 and the first conductive structures 34.

Figure 9:
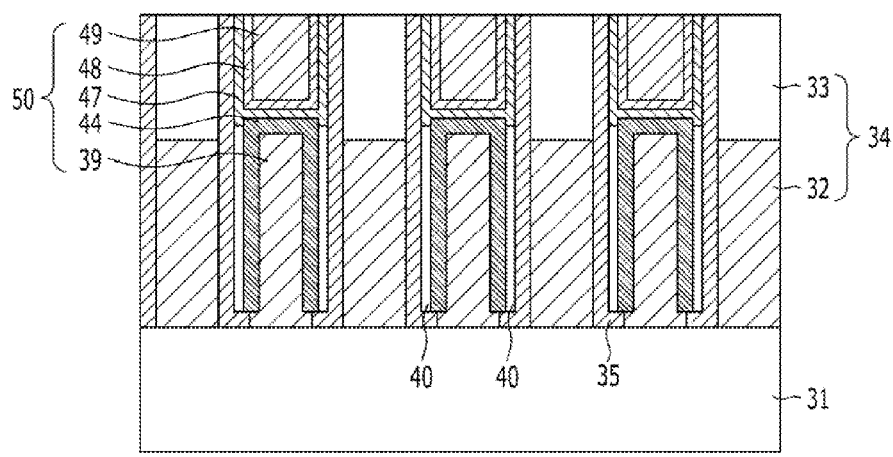
FIG. 9 is a cross-sectional view illustrating another exemplary method for capping air gaps in the semiconductor device in accordance with the third embodiment.

FIG. 9 is a cross-sectional view illustrating another exemplary method for capping the air gaps in the semiconductor device in accordance with the third embodiment. In FIG. 7I and FIG. 9, like reference numerals are used to refer to the same elements.

Referring to FIG. 9, barrier patterns 47, glue patterns 48 and fourth conductive patterns 49 are formed on the third conductive patterns 44. Accordingly, each of second conductive structures 50 formed in the openings 37 includes the second conductive pattern 39, the third conductive pattern 44, the barrier pattern 47, the glue pattern 48, and the fourth conductive pattern 49. The third conductive patterns 44 and the air gaps 40 are capped by the barrier patterns 47.

According to the third embodiment and the modification thereof, by defining the air gaps 40, the parasitic capacitance between the first conductive structures 34 and the second conductive structures 46 and 50 may be reduced.

Additionally, since the third conductive patterns 44 include a silicide layer, the sheet resistance (Rs) of the second conductive structures 46 and 50 may be reduced. In particular, since a low resistance silicide layer is included, the sheet resistance (Rs) of the second conductive structures 46 and 50 may be further reduced. As the sheet resistance (Rs) is reduced, a contact resistance (Rc) may be improved.

Furthermore, it is possible to cap the air gaps 40 using a conductive material without using a dielectric material. As a consequence, a parasitic capacitance (Cb) may be reduced due to the air gaps 40, a sheet resistance (Rs) may be reduced by the low resistance silicide layer, and the contact resistance (Rc) of the second conductive structures 46 and 50 may be improved.

Figure 10A:
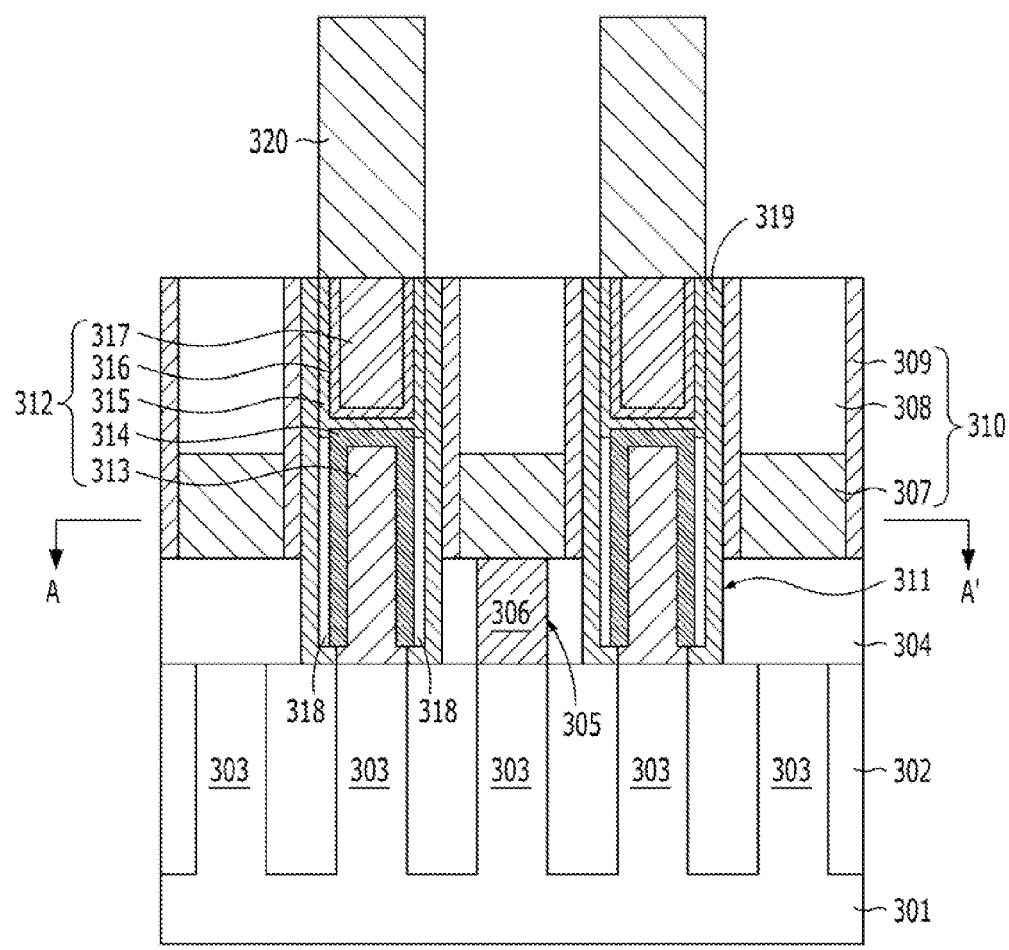
FIG. 10A is a cross-sectional view illustrating exemplary memory cells of a semiconductor device.
Figure 10B:
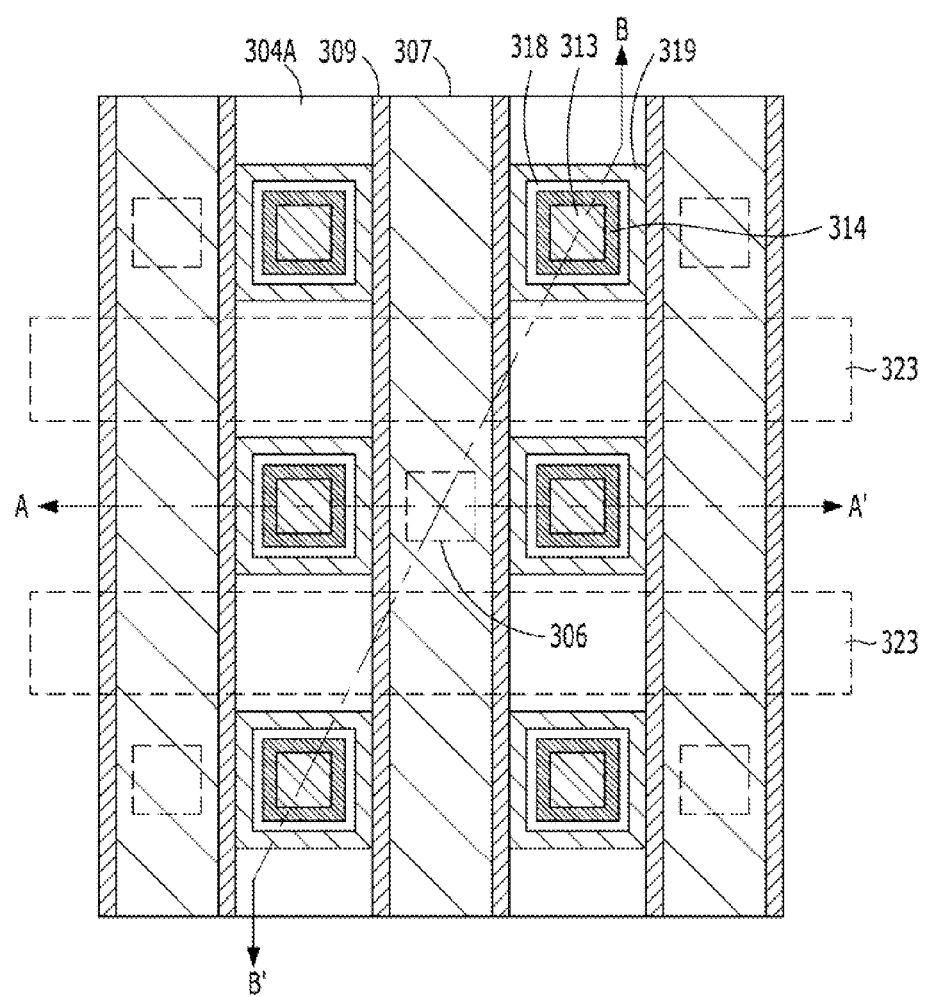
FIG. 10B is a plan view taken along the line A-A' of FIG. 10A.
Figure 10C:
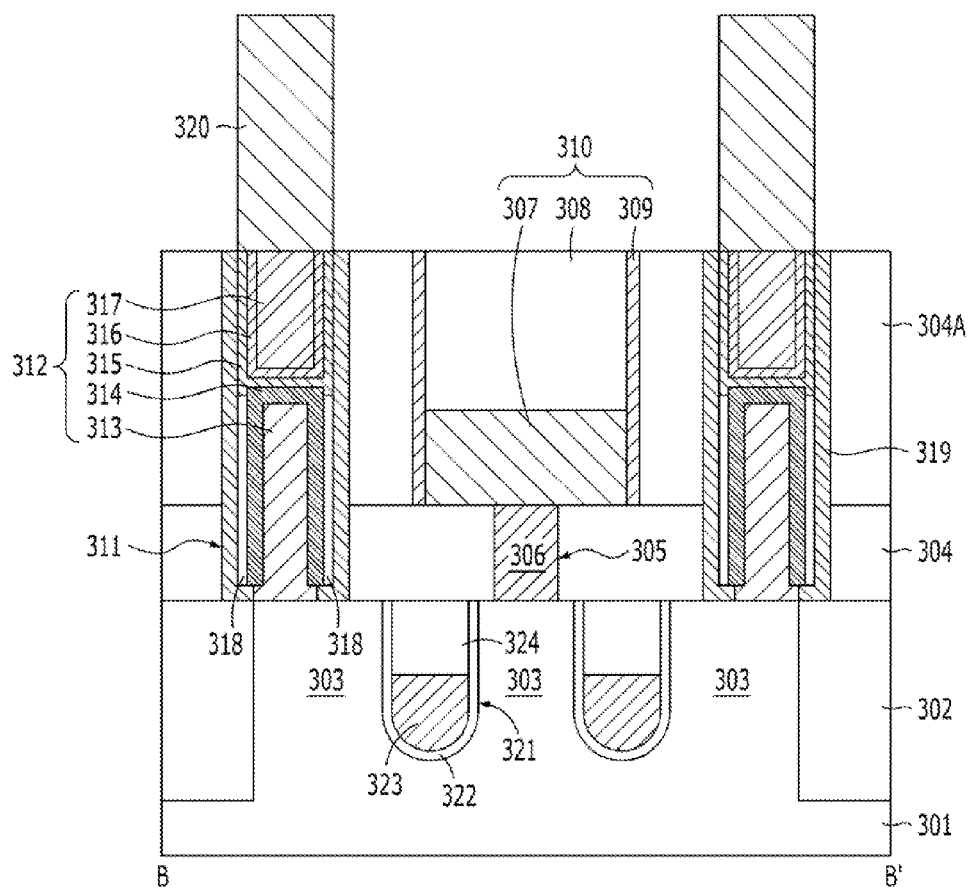
FIG. 10C is a cross-sectional view taken along the line B-B' of FIG. 10B.

FIG. 10A is a cross-sectional view illustrating exemplary memory cells of a semiconductor device. FIG. 10B is a plan view taken along the line A-A' of FIG. 10A. FIG. 10C is a cross-sectional view taken along the line B-B' of FIG. 10B. The memory cells shown in FIG. 10A include the memory cells of a DRAM.

Referring to FIGS. 10A to 10C active regions 303 are defined in a substrate 301 by isolation regions 302. Gate trenches 321 are formed across the active regions 303. Gate dielectric layers 322 are formed along the surface of the gate trenches 321. Buried gate electrodes 323 are formed on the gate dielectric layer 322 in such a way as to fill a lower portion of the gate trenches 321. While not shown, source regions and drain regions are formed in the substrate 301. Sealing layers 324 are formed on the buried gate electrodes 323. Bit line structures 310, which include bit lines 307 extending in a direction crossing with the buried gate electrodes 323, are formed.

Each of the bit line structures 310 includes a bit line 307, a bit line hard mask 308, and a bit line spacer 309. The bit line 307 is connected with the active region 303 through a bit line contact plug 306. The bit line contact plug 306 is formed in a bit line contact hole 305 that is defined in a first interlayer dielectric layer 304.

Storage node contact plugs 312 are formed to be connected with the active regions 303. The storage node contact plugs 312 are formed in storage node contact holes 311 that penetrate the first interlayer dielectric layer 304 and a second interlayer dielectric layer 304A. Each of the storage node contact plugs 312 includes a first plug 313, an ohmic contact layer 314, a barrier pattern 315, a glue pattern 316 and a second plug 317. The first plug 313 is a silicon plug which includes polysilicon. The second plug 317 is a metal plug which includes tungsten. The ohmic contact layer 314 covers the top surface and the sidewalls of the first plug 313.

dielectric structures including air gaps 318 and spacers 319 are formed between the storage node contact plugs 312 and the bit lines 307. The air gaps 318 are capped by the barrier patterns 315. The air gaps 318 and the barrier patterns 315 may be defined and formed by applying the methods described in the exemplary embodiments.

Capacitors including storage nodes 320 are connected to the storage node contact plugs 312. Each of the storage nodes 320 has a pillar shape. While not shown, a dielectric layer and plate nodes may be formed on the storage nodes 320. Each of the storage nodes 320 may have a cylinder shape instead of the pillar shape.

As can be seen from the above descriptions, each memory cell includes a buried gate type transistor including the buried gate electrode 323, the bit line 307, the storage node contact plug 312, and the capacitor including storage nodes 320. The storage node contact plug 312 is separated from the sidewalls of the bit lines 307 by the air gaps 318. Therefore, the parasitic capacitance between the bit line 307 and the storage node contact plug 312 may be reduced.

Figure 11:
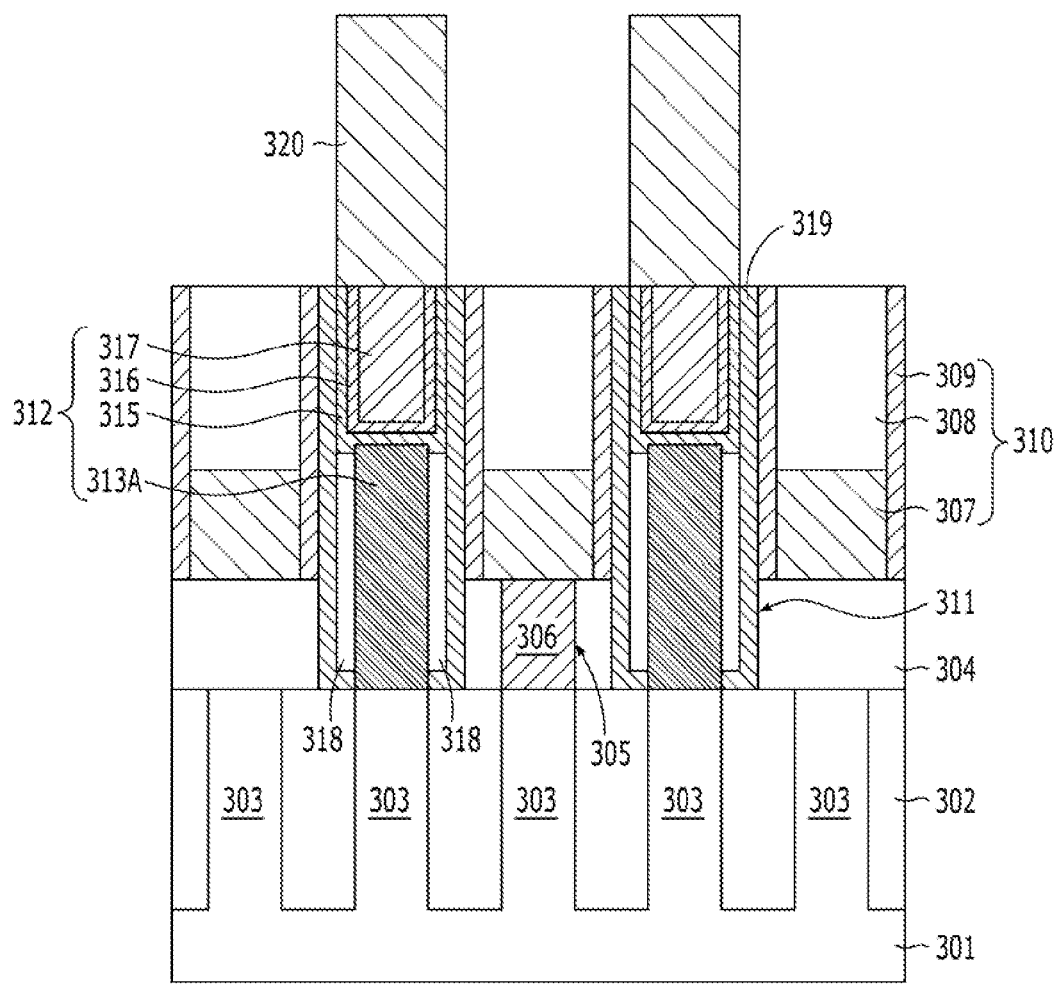
FIG. 11 is a cross-sectional view illustrating a modification of the exemplary memory cells of FIG. 10A.

FIG. 11 is a cross-sectional view illustrating a modification of the exemplary memory cells of FIG. 10A. In FIG. 10A and FIG. 11, like reference numerals are used to refer to the same elements.

Referring to FIG. 11, each storage node contact plug 312 includes a first plug 313A, the barrier pattern 315, the glue pattern 316, and the second plug 317. The first plug 313A includes metal silicide. That is, the first plug 313A is a silicide plug. The second plug 317 is a metal plug which includes tungsten.

FIGS. 12A to 12I are cross-sectional views illustrating an exemplary method for fabricating the exemplary memory cells of FIG. 10A.

Figure 12A:
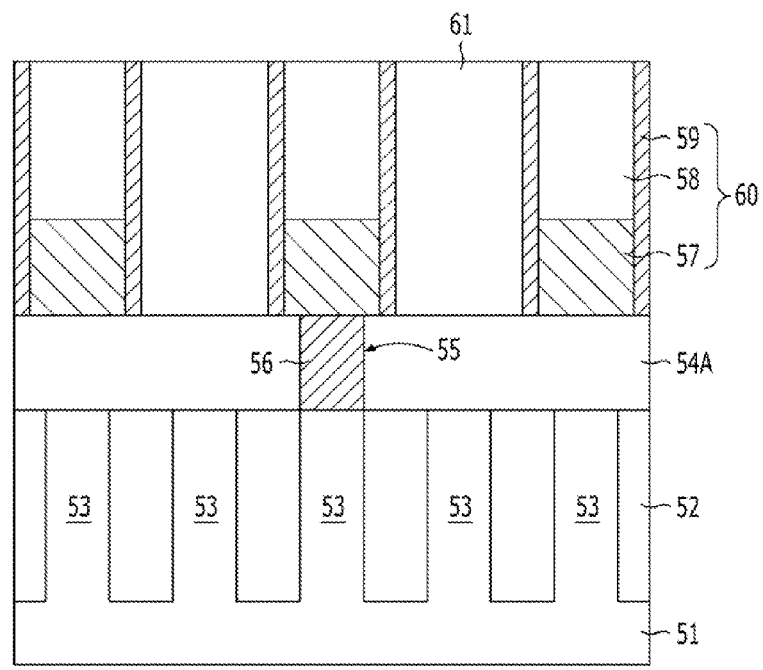
FIGS. 12A to 12I are cross-sectional views illustrating an exemplary method for fabricating the exemplary memory cells of FIG. 10A.

Referring to FIG. 12A, isolation regions 52 are formed in a substrate 51. Active regions 53 are defined by the isolation regions 52. The substrate 51 may include a silicon substrate, a silicon germanium substrate, or an SOI substrate. The isolation regions 52 may be formed by a shallow trench isolation (STI) process. The isolation regions 52 may be formed by sequentially forming a wall oxide, a liner and a gap-fill material. The liner may include silicon nitride or silicon oxide. The silicon nitride may include $Si_3N_4$, and the silicon oxide may include $SiO_2$. The gap-fill material may include silicon oxide such as a spin-on-dielectric (SOD). In an alternative embodiment, the gap-fill material may include silicon nitride which is used as the liner.

While not shown, after forming the isolation regions 52, buried gate electrodes (see the reference numeral '323' in FIG. 10C) may be formed.

Hereinafter, a method for forming the buried gate electrodes will be described with reference to FIG. 10C.

First, after defining the gate trenches 321 by etching the substrate 301, the buried gate electrodes 323 are formed to be recessed in the gate trenches 321. Thereafter, the sealing layer 324 is formed on the buried gate electrodes 323. Before forming the buried gate electrodes 323, the gate dielectric layer 322 may be formed along the surface of the gate trenches 321. The buried gate electrodes 323 may be formed by forming a metal-containing layer to fill the gate trenches 321 and then etching back the metal-containing layer. The metal-containing layer may include a material which includes metal, such as titanium, tantalum, and tungsten, as a main constituent. The metal-containing layer may include at least any one selected from the group consisting of tantalum nitride (TaN), titanium nitride (TIN), tungsten nitride (WN), and tungsten (W). For example, the buried gate electrodes 323 may include a single layer structure having any of titanium nitride, tantalum nitride, and tungsten, or may include a dual layer structure such as TiN/W or TaN/W in which tungsten (W) is stacked on titanium nitride (TiN) or tantalum nitride (TaN). Also, the buried gate electrodes 323 may include a dual layer structure such as WN/W in which tungsten (W) is stacked on a tungsten nitride (WN), and also may include a low-resistance metal material. The sealing layer 324 may fill the gate trenches 321 on the buried gate electrodes 323. The sealing layer 324 may protect the buried gate electrodes 323 from a subsequent process. The sealing layer 324 may include a dielectric material. The sealing layer 324 may include silicon nitride. After forming the sealing layer 324, source regions and drain regions (not shown) may be formed in the active regions 303. Consequently, buried gate type transistors including the buried gate electrodes 323 are formed.

Referring back to FIG. 12A, a first interlayer dielectric layer 54A is formed on the entire surface of the substrate 51. The first interlayer dielectric layer 54A may include silicon oxide or silicon nitride. An etch stop layer (not shown) including silicon nitride may be formed on the first interlayer dielectric layer 54A.

A bit line contact hole 55 is defined by etching the first interlayer dielectric layer 54A. In order to define the bit line contact in hole 55, mask patterns (not shown) may be used as an etch mask. After defining the bit line contact hole 55, the active regions 53 may be recessed by a set depth. Accordingly, it is possible to increase the contact area between a bit line contact plug 56 to be subsequently formed and the active regions 53. The active regions 53 which are exposed by the bit line contact hole 55 include any one of source regions and drain regions of the buried gate type transistors.

The bit line contact plug 56 is formed in the bit line contact hole 55. The bit line contact plug 56 is formed in the bit line contact hole 55. To form the bit line contact plug 56, after forming a conductive layer (not shown) on the entire surface of the resultant structure to fill the bit line contact hole 55, the conductive layer may be planarized. The bit line contact plug 56 may include a polysilicon layer or a metal layer.

Bit lines 57 and bit line hard masks 58 are formed on the bit line contact plug 56. In an alternative embodiment, a line width of the bit lines 57 and the bit line hard masks 58 may be set to be smaller than the bit line contact hole 55 such as to etch the bit line contact plug 56. In this case, although the sidewalls of the bit line contact hole 55 may be exposed as the bit line contact plug 56 is etched, the exposed sidewalls may be filled by bit line spacers 59 which are to be subsequently formed. The bit lines 57 include a metal-containing layer such as tungsten. The bit line hard masks 58 include silicon nitride.

The bit line spacers 59 are formed on the sidewalls of the bit lines 57 and the bit line hard masks 58. The bit line spacers 59 may include silicon nitride.

By forming the bit line spacers 59 as described above, bit line structures 60 each including the bit line 57, the bit line hard mask 58 and the bit line spacers 59 are formed.

While not shown, the process for forming the bit line structures 60 may be performed simultaneously with a process for forming the gate structures of transistors formed in a peripheral circuit region. Gate structures including silicon electrodes the same as bit line contact plugs and metal electrodes the same as bit lines, may be formed.

A second interlayer dielectric layer 61 is formed on the entire surface of the resulting structure including the bit line structures 60. The second interlayer dielectric layer 61 may be subsequently patterned or planarized to fill the spaces between adjacent bit line structures 60.

Figure 12B:
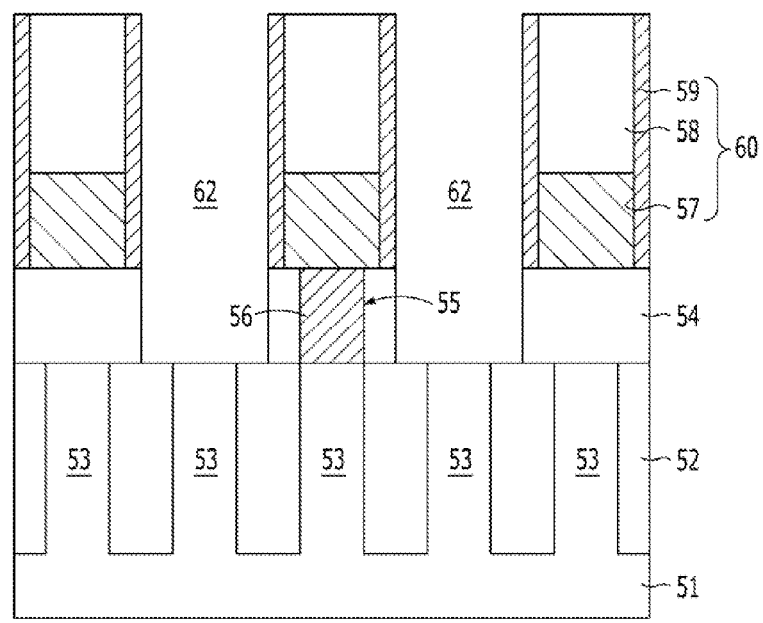

Referring to FIG. 12B, the second interlayer dielectric layer 61 and the first interlayer dielectric layer 54A shown in FIG. 12A are etched using mask patterns (not shown) as an etch mask. A first interlayer dielectric layer 54 is formed. Accordingly, storage node contact holes 62 are defined between the bit line structures 60. The storage node contact holes 62 may be defined in a self-aligned manner by the bit line structures 60. Therefore, the sidewalls of adjacent bit line structures 60 are exposed by the storage node contact holes 62. The surface of portions of the substrate 51 is exposed by the storage node contact holes 62. The active regions 53 which are exposed by the storage node contact holes 62 include any one of the source regions and drain regions of the buried gate type transistors. While not shown, a lower portion of the storage node contact holes 62 may be enlarged by subsequently performing wet etching. At this time, portions of the first interlayer dielectric layer 54 are isotropically etched. While not shown, after defining the storage node contact holes 62, the second interlayer dielectric layer 61 remains. That is, the second interlayer dielectric layer 61 which is formed in the storage node contact holes 62 remains between the bit line structures 60.

Figure 12C:
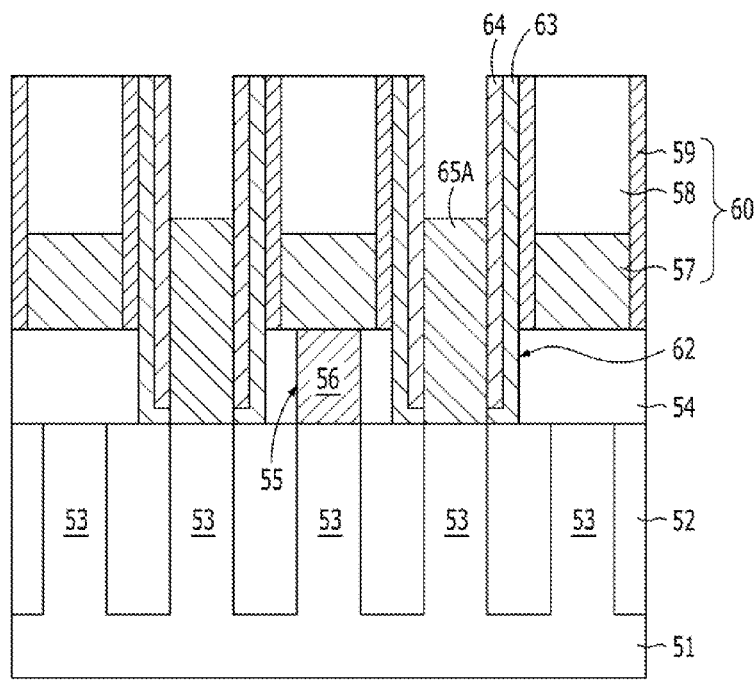

Referring to FIG. 12C, spacers 63 and sacrificial spacers 64 are formed on the sidewalls of the storage node contact holes 62. For example, a dielectric layer (not shown) and a sacrificial layer (not shown) are formed. The sacrificial spacers 64 are formed by etching back the sacrificial layer. The dielectric layer which is exposed by the sacrificial spacers 64 is etched back. Accordingly, the spacers 63 are formed. The spacers 63 are formed on the sidewalls of the storage node contact holes 62. The sacrificial spacers 64 are formed on the sidewalls of the spacers 63. By forming the sacrificial spacers 64, the surfaces of the active regions 53 are exposed on the bottoms of the storage node contact holes 62. In an alternative embodiment, the sacrificial spacers 64 may be formed without forming the spacers 63 so as to increase a line width of storage node contact plugs.

First plugs 65A are formed in the storage node contact holes 62. The first plugs 65A fill a part of the storage node contact holes 62. That is, the first plugs 65A are formed in such a way as to be recessed in the storage node contact holes 62. The first plugs 65A are formed by forming a conductive layer (not shown) on the entire surface of the resulting structure to fill the storage node contact holes 62 and then recessing the conductive layer. The recessed surfaces of the first plugs 65A may be controlled to be higher than the top surface of the bit lines 57. The first plugs 65A may have a height to minimize an area between each first plug 65A and each bit line 57 arranged opposite one another. Accordingly, the parasitic capacitance between the bit lines 57 and the first plugs 65A may be reduced. The first plugs 65A include a silicon-containing layer. The first plugs 65A may include a polysilicon layer. The first plugs 65A become silicon plugs.

By forming the recessed first plugs 65A, the top surfaces and the sidewalls of the sacrificial spacers 64 are exposed.

Figure 12D:
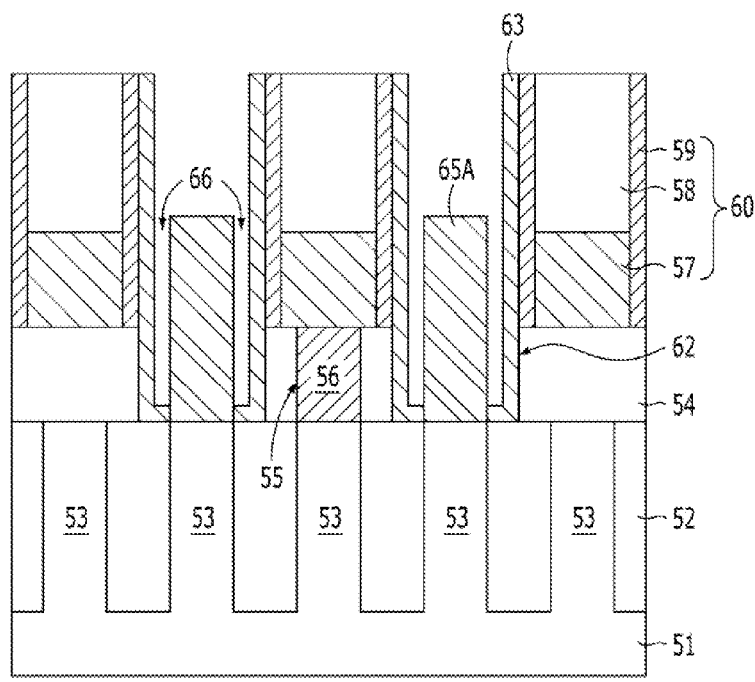

Referring to FIG. 12D, the sacrificial spacers 64 are removed. To remove the sacrificial spacers 64, a strip process is performed. The strip process may include a cleaning process. The cleaning process uses a wet chemical capable of removing the sacrificial spacers 64.

After the sacrificial spacers 64 are removed by the strip process, the spaces occupied by the sacrificial spacers 64 remain as air gaps 66.

The air gaps 66 are defined between the first plugs 65A and the sidewalls of the storage node contact holes 62. Dielectric structures comprised of the air gaps 66 and the spacers 63 are formed between the first plugs 65A and the bit line structures 60.

Figure 12E:
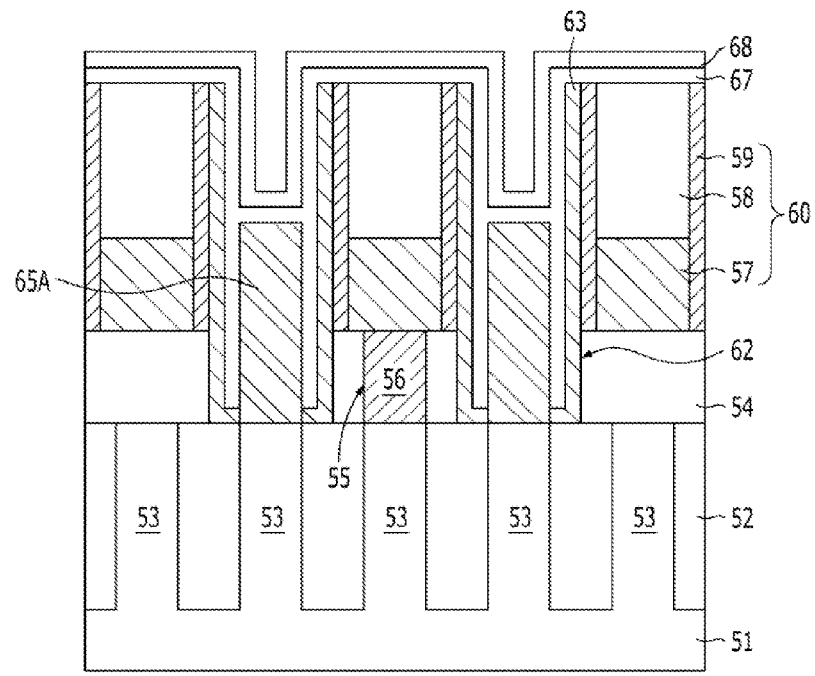

Referring to FIG. 12E, a silicidable layer 67 is formed. The silicidable layer 67 is formed over the entire surface of the resulting structure while covering the first plugs 65A. The silicidable layer 67 is formed on the top surfaces and sidewalls of the first plugs 65A which are exposed due to the air gaps 66 shown in FIG. 12D. The silicidable layer 67 may gap-fill the air gaps 66 shown in FIG. 12D. The silicidable layer 67 includes a material capable of forming silicide on the top surfaces and the sidewalls of the first plugs 65A. The silicidable layer 67 includes a silicidable metal. For example, the silicidable metal may include titanium, cobalt, tungsten, or nickel, The silicidable layer 67 may be formed by CVD. Accordingly,. the silicidable layer 67 is formed with a uniform thickness on the top surfaces and the sidewalls of the first plugs 65A. The silicidable metals are all conductive materials.

Hereinafter, in the exemplary embodiment, the silicidable layer 67 includes cobalt.

A capping layer 68 is formed on the silicidable layer 67, The capping layer 68 is conformally formed. The capping layer 68 prevents a silicide layer to be subsequently formed, from being attacked. The capping layer 68 is formed by ALD. The capping layer 68 includes metal nitride. The capping layer 68 includes a titanium-containing material. The capping layer 68 may include titanium nitride (TiN). The capping layer 68 may be formed by stacking titanium and titanium nitride. The capping layer 68 may be formed in the air gaps 66 or may not be formed in the air gaps 66. For example, when the silicidable layer 67 is formed without gap-filling the air gaps 66, the capping layer 68 may be formed in the air gaps 66. When the silicidable layer 67 gap-fills the air gaps 66, the capping layer 68 is not formed in the air gaps 66.

According to the above descriptions, the silicidable layer 67 is formed to cover the top surfaces and the sidewalls of the first plugs 65A. Therefore, because the contact area between the first plug 65A and the silicidable layer 67 increases, an area for forming a silicide layer to be subsequently formed increases.

Figure 12F:
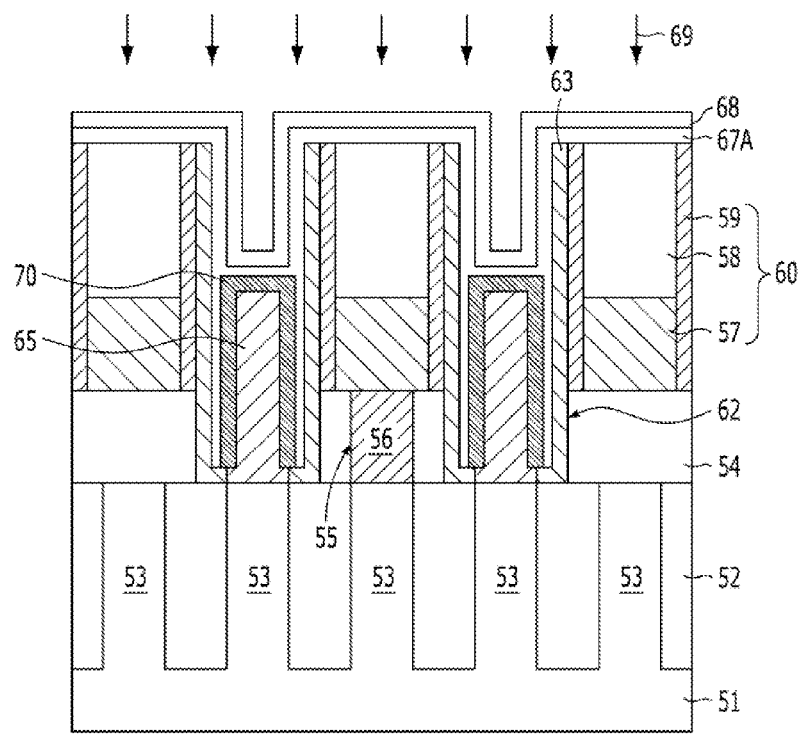

Referring to FIG. 12F, an ohmic contact layer 70 is formed. In order to form the ohmic contact layer 70, a thermal process may be performed. The thermal process includes an annealing process 69. The annealing process 69 is performed to make the first plugs 65A shown in FIG. 12E and the silicidable layer 67 shown in FIG. 12E react with each other. A silicidation reaction occurs along the interface where the first plugs 65A shown in FIG. 12E and the silicidable layer 67 shown in FIG. 12E contact each other. Accordingly, a suicide layer is formed. The silicide layer becomes the ohmic contact layer 70. The annealing process 69 may be performed at a temperature of at least 200° C. The annealing process 69 includes an RTA process.

As the annealing process 69 is performed, the silicon of the first plugs 65A shown in FIG. 12E and the metal of the silicidable layer 67 shown in FIG. 12E react with each other, and a metal silicide layer is formed. The metal suicide layer may include titanium silicide, cobalt silicide, nickel silicide, or tungsten silicide. Since the first plugs 65A shown in FIG. 12E include polysilicon and the silicidable layer 67 shown in FIG. 12E includes cobalt, a cobalt silicide layer is formed by the annealing process 69.

In order to form the cobalt silicide layer, the annealing process 69 may be performed twice. By a primary annealing process, cobalt silicide with a phase of $CoSi_x$ ($=0.1{\sim}1.5$) is formed. A secondary annealing process is performed after the primary annealing process. The secondary annealing process may be performed at a temperature higher than the primary annealing process. The secondary annealing process is performed at a temperature ranging from approximately 600° C. to approximately 800° C. A phase change of the cobalt silicide layer occurs by the secondary annealing process, For example, a phase change to cobalt silicide with the phase of $CoSi_2$ occurs by the secondary annealing process. The resistivity of the cobalt silicide with the phase of $CoSi_2$ is lower than the cobalt silicide with the phase of $CoSi_x$ ($x=0.1{\sim}1.5$). By forming the cobalt silicide with the phase of $CoSi_2$, it is possible to form cobalt silicide with a lower resistance. The secondary annealing process may be performed after removing an unreacted silicidable layer 67A.

Because the ohmic contact layer 70 is formed by consuming the silicon of the first plugs 65A shown in FIG. 12E, the first plugs 65A shown in FIG. 12E may be reduced in their volumes as indicated by the reference numeral 65. After the annealing process 69, the first plugs 65 are covered by the ohmic contact layer 70.

As described above, the ohmic contact layer 70 which covers the top surfaces and sidewalls of the first plugs 65 is formed by the silicidation reaction.

The unreacted silicidable layer 67A may remain on the ohmic contact layer 70.

Figure 12G:
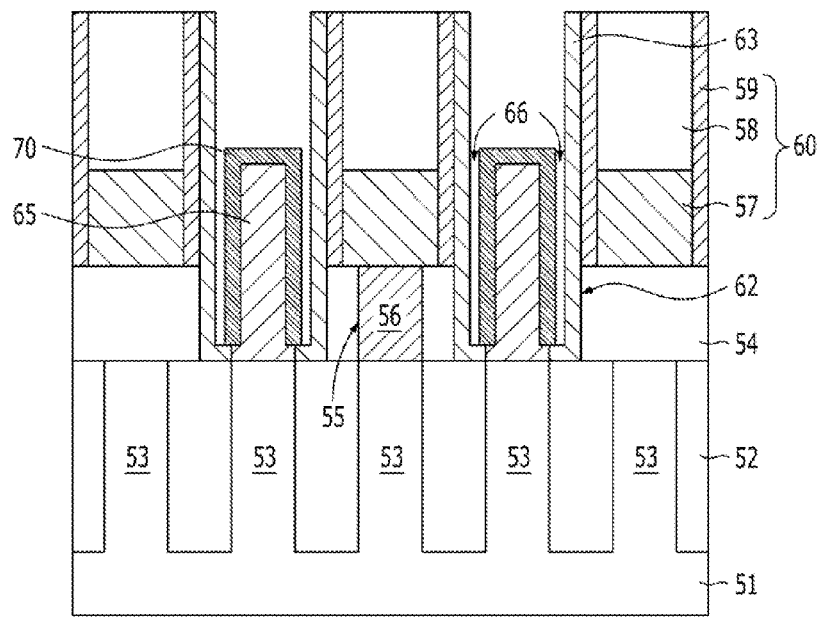

Referring to FIG. 12G, the unreacted silicidable layer 67A shown in FIG. 12F and the capping layer 68 shown in FIG. 12E are removed. In order to remove the unreacted silicidable layer 67A shown in FIG. 12E and the capping layer 68 shown in FIG. 12E, a strip process is performed. The strip process includes a cleaning process using a wet chemical.

By the strip process, the unreacted silicidable layer 67A shown in FIG. 12E is removed, and accordingly, the air gaps 66 are opened again. The air gaps 66 are defined between the ohmic contact layer 70 and the sidewalls of the bit line structures 60.

Figure 12H:
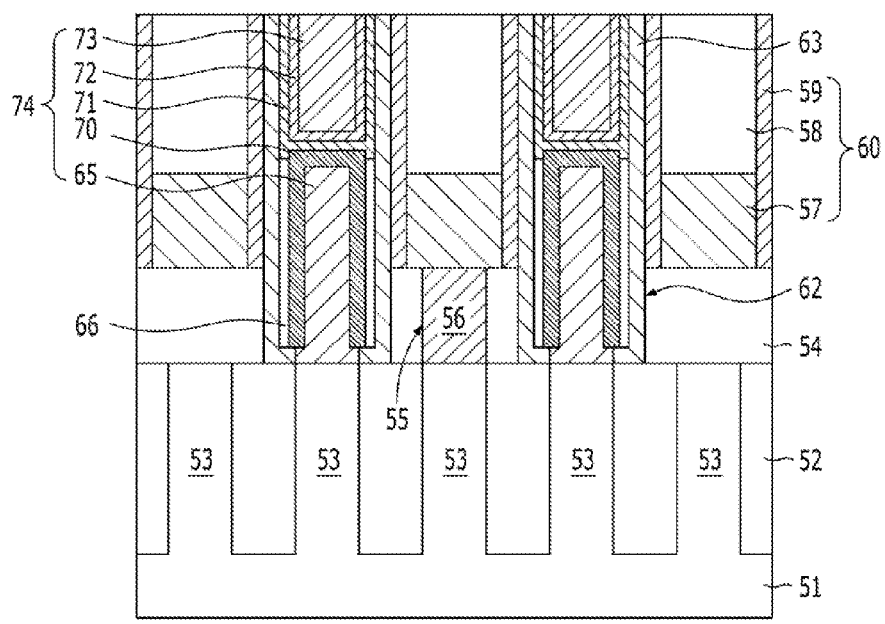

Referring to FIG. 12H, conductive structures are formed in such a way as to cap the air gaps 66 and cover the top surface and the side walls of an upper portion of the ohmic contact layer 70. For example, barrier patterns 71, glue patterns 72 and second plugs 73 are formed on the ohmic contact layer 70 over the air gaps 66. The barrier patterns 71 cap the air gaps 66. A material used as the barrier patterns 71 is controlled to have a thickness that does not fill but caps the air gaps 66. By controlling the thickness of the barrier patterns 71, it is possible to cover the top surface of the ohmic contact layer 70 and cover the sidewalls of the ohmic contact layer 70.

The barrier patterns 71 include a titanium layer. The glue patterns 72 may include titanium nitride (TiN). The second plugs 73 are formed to fill the remainders of the storage node contact holes 62 on the glue patterns 72. The second plugs 73 may include a metal-containing layer. The second plugs 73 may include a tungsten layer. The second plugs 73 become metal plugs.

In this way, the barrier patterns 71, the glue patterns 72 and the second plugs 73 are formed on the ohmic contact layer 70. Accordingly, storage node contact plugs 74 formed in the storage node contact holes 62 include the first plugs 65, the ohmic contact layer 70, the barrier patterns 71, the glue patterns 72 and the second plugs 73. The ohmic contact layer 70 forms ohmic contacts between the first plugs 65 and the second plugs 73. When the first plugs 65 include a silicon-containing layer and the second plugs 73 include a metal-containing layer, the first plugs 65 and the second plugs 73 become semi-metal plug structures.

The air gaps 66 are defined between the first plugs 65 and the sidewalls of the storage node contact holes 62. Dielectric structures constituted by the air gaps 66 and the spacers 63 are formed between the storage node contact plugs 74 and the bit line structures 60. The air gaps 66 are capped by the barrier patterns 71.

In an alternative embodiment, the air gaps 66 and the ohmic contact layer 70 may be capped using only the second plugs 73.

Figure 12I:
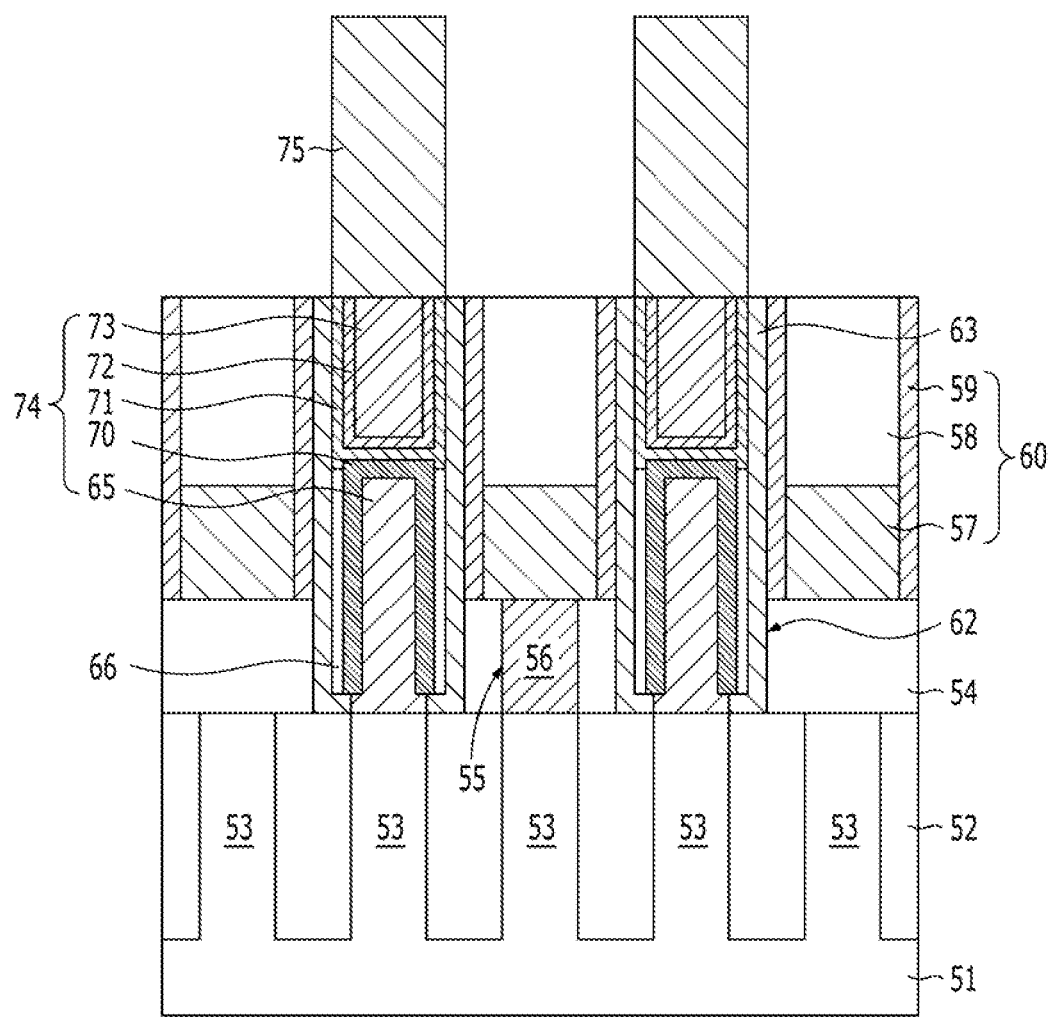

Referring to FIG. 12I storage nodes 75 are formed on the storage node contact plugs 74, While not shown, a dielectric layer and plate nodes may be formed on the storage nodes 75. The storage nodes 75 have a pillar shape and may have a cylinder shape in an alternative embodiment.

The semiconductor devices according to the exemplary embodiments may be applied to a dynamic random access memory (DRAM), without a limiting sense, and may also be limited to a memory such as a static RAM (SRAM), a flash memory, a ferroelectric RAM (FeRAM), a magnetic RAM (MRAM) and a phase change RAM (PRAM).

Figure 13:
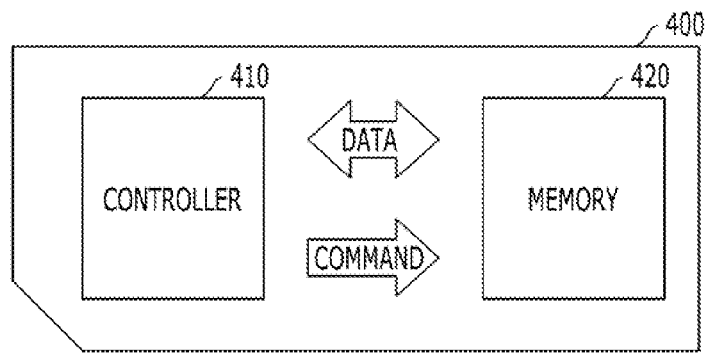
FIG. 13 is a schematic diagram illustrating an exemplary memory card.

FIG. 13 is a schematic diagram illustrating an exemplary memory card.

Referring to FIG. 13, the memory card 400 may include a controller 410 and a memory 420. The controller 410 and the memory 420 may exchange electric signals. For example, the memory 420 and the controller 410 may exchange data in response to a command from the controller 410. Accordingly, the memory card 400 may store data in the memory 420, or output data from the memory 420 to the outside of the memory 420. The memory 420 may include the semiconductor device with the air gaps described above. The memory card 400 may be used as data storage media of various portable appliances. For example, the memory card 400 may include a memory stick card, a smart media card (SM), a secure digital (SD), a mini secure digital card (mini SD), or a multimedia card (MMC).

Figure 14:
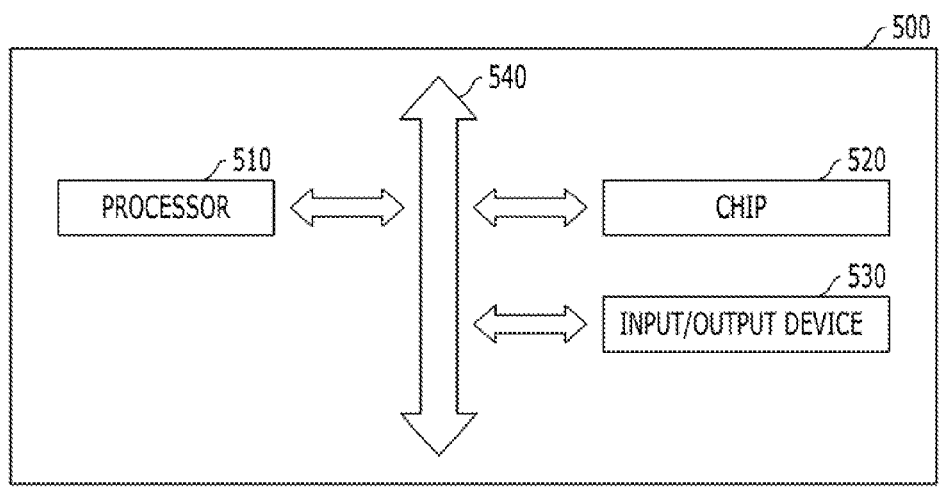
FIG. 14 is a block diagram illustrating an exemplary electronic system.

FIG. 14 is a block diagram illustrating an exemplary electronic system.

Referring to FIG. 14, the electronic system 500 may include a processor 510, an input/output device 530, and a chip 520 which may perform data communication through a bus 540. The processor 510 may serve to execute a program and control the electronic system 500. The input/output device 530 may be used in inputting and outputting data to and from the electronic system. The electronic system 500 may be connected with an external device, for example, a personal computer or a network, and may exchange data with the external device through the input/output device 530. The chip 520 may store codes and data for operations of the processor 510, and may perform some operations assigned by the processor 510. For example, the chip 520 may include the semiconductor device with the air gaps described above. The electronic system 500 may comprise various electronic control apparatuses which need the chip 520, and may be used, for example, in a mobile phone, an MP3 player, a navigator, a solid state disk (SSD), a household appliance, etc.

Although various embodiments have been described for illustrative purposes, it will be apparent to those skilled in the art that various changes and modifications may be made without departing from the spirit and scope of the invention as defined in the following claims.

What is claimed is:

1. A method for fabricating a semiconductor device, the method comprising:
forming a plurality of conductive structures including first conductive patterns over a substrate;
forming a dielectric layer over the conductive structures;
etching the dielectric layer to define openings between the conductive structures;
forming sacrificial spacers over sidewalls of the openings;
forming second conductive patterns recessed in the openings over the sacrificial spacers;
removing the sacrificial spacers to define air gaps;
forming third conductive patterns which are separated from the first conductive patterns by the air gaps, and cover sidewalls and top surfaces of the second conductive patterns; and
forming fourth conductive patterns which cap the air gaps over the third conductive patterns,
wherein the forming third conductive patterns comprises:
forming a metal layer over an entire surface to gap-fill the air gaps;

performing an annealing process to react the metal layer with the first conductive patterns, and form a silicide layer: and removing an unreacted metal layer.

2. The method according to claim 1, wherein the silicide layer comprises cobalt silicide with a phase of CoSi2.

3. The method according to claim 1, before the forming fourth conductive patterns, the method further comprising:

forming a barrier layer which caps the air gaps and the third conductive patterns; and forming a glue layer over the barrier layer.

4. The method according to claim 3, wherein the barrier layer is formed to cover a top surface and sidewalls of an upper portion of each third conductive pattern.

5. The method according to claim 1, wherein the second conductive patterns comprise a silicon-containing material.

6. A method for fabricating a semiconductor device, the method comprising:

forming a plurality of bit line structures including bit lines over a substrate;

forming a dielectric layer over the bit line structures;

etching the dielectric layer to define contact holes between the bit line structures;

forming sacrificial spacers over sidewalls of the contact holes;

forming silicon plugs recessed in the contact holes over the sacrificial spacers;

removing the sacrificial spacers to define air gaps;

forming ohmic contact layers which are separated from the bit lines by the air gaps, and cover sidewalls and top surfaces of the silicon plugs; and forming metal plugs which cap the air gaps over the ohmic contact layer, wherein the forming an ohmic contact layer comprises:

forming a metal layer over an entire surface to gap-fill the air gaps;

performing an annealing process to react the metal layer with the silicon plugs, and form a silicide layer; and removing an unreacted metal layer.

7. The method according to claim 6, wherein the silicide layer comprises cobalt silicide with a phase of CoSi2.

8. The method according to claim 6, before the forming metal plugs, the method further comprising:

forming a barrier layer which caps the air gaps and the ohmic contact layer; and forming a glue layer over the barrier layer.

9. The method according to claim 8, wherein the barrier layer is formed to cover a top surface and sidewalls of an upper portion of each ohmic contact layer.

10. The method according to claim 6, further comprising:

forming buried gate type transistors which include gate electrodes buried in the substrate before the forming bit line structures.

11. The method according to claim 6, further comprising:

forming memory elements over the metal plugs.

* * * * *